(12) United States Patent
Lee et al.

(10) Patent No.: US 11,195,441 B2
(45) Date of Patent: *Dec. 7, 2021

(54) DISPLAY DEVICE

(71) Applicant: Samsung Display Co., Ltd., Yongin-si (KR)

(72) Inventors: Ah-ram Lee, Cheonan-si (KR); Myoung-ha Jeon, Asan-si (KR); Hongkwon Kim, Hwaseong-si (KR); Seongsik Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,631

(22) Filed: Jun. 8, 2020

(65) Prior Publication Data
US 2020/0302842 A1 Sep. 24, 2020

Related U.S. Application Data

(63) Continuation of application No. 16/376,570, filed on Apr. 5, 2019, now Pat. No. 10,679,536.

(30) Foreign Application Priority Data

Jul. 18, 2018 (KR) .................. 10-2018-0083232

(51) Int. Cl.
*G09G 3/00* (2006.01)
*G09G 3/3275* (2016.01)
(Continued)

(52) U.S. Cl.
CPC ........... *G09G 3/006* (2013.01); *G09G 3/3275* (2013.01); *H01L 27/323* (2013.01);
(Continued)

(58) Field of Classification Search
CPC .. G09G 3/006; G09G 3/3275; G09G 2330/12; H01L 27/323; H01L 27/3276;
(Continued)

(56) References Cited

U.S. PATENT DOCUMENTS 9,356,087 B1 * 5/2016 Lee .................... H01L 27/1218
9,563,320 B2 2/2017 Lee et al.
(Continued)

FOREIGN PATENT DOCUMENTS

EP              3 330 951      6/2018
KR       10-2016-0025889       3/2016
(Continued)

OTHER PUBLICATIONS

Notice of Allowance dated Jan. 29, 2020, in U.S. Appl. No. 16/376,570.

*Primary Examiner* — Dmitriy Bolotin
(74) *Attorney, Agent, or Firm* — H.C. Park & Associates, PLC

(57) ABSTRACT

A display device including: a base layer including a first region, a second region, and a bending region, the bending region including a first bending region adjacent to the first region and a second bending region adjacent to the second region; pixels disposed on the first region; pads disposed on the second region; signal lines electrically connected to the pixels and disposed on the first region, the bending region, and the second region; a first sensor line disposed on the first bending region; first sensor connection lines electrically connected to the first sensor line, extending through the first bending region, the second bending region, and the second region; a second sensor line disposed on the second bending region and between the first sensor line and the second region; and second sensor connection lines electrically con- (Continued)

nected to the second sensor line, extending through the second bending region and the second region.

16 Claims, 22 Drawing Sheets

(51) Int. Cl.
  *H01L 27/32* (2006.01)
  *H01L 51/00* (2006.01)
  *G06F 3/044* (2006.01)
(52) U.S. Cl.
  CPC ...... *H01L 27/3276* (2013.01); *H01L 51/0097* (2013.01); *G06F 3/044* (2013.01); *G09G 2330/12* (2013.01); *H01L 2251/5338* (2013.01)
(58) Field of Classification Search
  CPC ......... H01L 51/0097; H01L 2251/5338; G06F 3/044
  See application file for complete search history.

(56) References Cited

U.S. PATENT DOCUMENTS

| | | | | |
|---|---|---|---|---|
| 10,679,536 | B2* | 6/2020 | Lee | H01L 27/323 |
| 2015/0102298 | A1* | 4/2015 | Namkung | H01L 51/0097 |
| | | | | 257/40 |
| 2016/0093644 | A1* | 3/2016 | Ki | H01L 27/1222 |
| | | | | 257/40 |
| 2016/0093685 | A1* | 3/2016 | Kwon | H01L 27/3276 |
| | | | | 257/40 |
| 2016/0181345 | A1* | 6/2016 | Lee | H01L 51/0097 |
| | | | | 257/40 |
| 2016/0181346 | A1* | 6/2016 | Kwon | H01L 27/124 |
| | | | | 257/40 |
| 2016/0190216 | A1* | 6/2016 | Yang | H01L 27/3276 |
| | | | | 257/91 |
| 2016/0210894 | A1* | 7/2016 | Lee | G02F 1/133305 |
| 2017/0060189 | A1* | 3/2017 | Sohn | G06F 1/1652 |
| 2017/0060283 | A1* | 3/2017 | Sohn | G06F 3/041 |
| 2017/0068275 | A1 | 3/2017 | Lee et al. | |
| 2017/0123558 | A1 | 5/2017 | Hong et al. | |
| 2017/0365650 | A1* | 12/2017 | Kwon | H01L 27/3276 |
| 2018/0007789 | A1* | 1/2018 | Kawata | H01L 27/3244 |
| 2018/0033398 | A1* | 2/2018 | Okamoto | H01L 27/3267 |
| 2018/0123060 | A1* | 5/2018 | Jang | H01L 51/0097 |
| 2018/0158741 | A1* | 6/2018 | Kim | H01L 22/12 |
| 2018/0337367 | A1* | 11/2018 | Tomioka | H01L 51/5203 |
| 2018/0342707 | A1* | 11/2018 | Lee | H01L 27/3279 |
| 2019/0011746 | A1* | 1/2019 | Que | G02F 1/13452 |
| 2019/0074332 | A1* | 3/2019 | Kim | G01B 7/287 |

FOREIGN PATENT DOCUMENTS

| | | |
|---|---|---|
| KR | 10-2017-0026046 | 3/2017 |
| KR | 10-2017-0030023 | 3/2017 |
| KR | 10-2017-0052805 | 5/2017 |
| KR | 10-2018-0064596 | 6/2018 |

* cited by examiner

DISPLAY DEVICE

CROSS-REFERENCE TO RELATED APPLICATION

This application is a Continuation of U.S. patent application Ser. No. 16/376,570, filed Apr. 5, 2019, which claims priority from and the benefit of Korean Patent Application No. 10-2018-0083232, filed on Jul. 18, 2018, which are hereby incorporated by reference for all purposes as if fully set forth herein.

BACKGROUND

Field

Exemplary embodiments of the invention relate generally to a display device and, more specifically, to a display device including a bendable display panel having a crack detector.

Discussion of the Background

A display device includes a flexible base layer and signal lines and conductive patterns disposed on the base layer. The base layer may be partially bent. In the case where the base layer has a bent portion, the signal lines and the conductive patterns may also be bent, and in this case, a stress may be exerted on the signal lines and the conductive patterns to cause a crack of the signal lines and the conductive patterns. Furthermore, the crack may lead to a functional failure of the display device. The functional failure of the display device may be detected by an inspection process on the display device. However, in the case where a fine crack is formed in the signal lines or the conductive patterns, the fine crack can gradually propagate over time, and a functional failure of the display device may not be detected during the inspection process of the manufacturing process of the display device. In other words, the crack, which is not detected during the inspection process, may gradually propagate, and in this case, the functional failure of the display device may occur when the display device is used by a user.

The above information disclosed in this Background section is only for understanding of the background of the inventive concepts, and, therefore, it may contain information that does not constitute prior art.

SUMMARY

Display devices constructed according to exemplary implementations of the invention can sense a bending failure of a display panel.

According to the principles and exemplary implementations of the invention, a bending region of a base layer may be divided into a plurality of bending regions, and resistor lines may be respectively disposed on each of the divided bending regions to detect changes in resistance for each bending regions and thereby determine whether there is a bending failure that may not be detected through inspection. Thus, functional failures and product reliability can be improved.

Additional features of the invention will be set forth in the description which follows, and in part will be apparent from the description, or may be learned by practice of the invention.

According to one or more embodiments of the invention, a display device includes: a base layer including a first region, a second region, and a bending region, the bending region including a first bending region adjacent to the first region and a second bending region adjacent to the second region; pixels disposed on the first region; pads disposed on the second region; signal lines electrically connected to the pixels and disposed on the first region, the bending region, and the second region; a first sensor line disposed on the first bending region; first sensor connection lines electrically connected to the first sensor line, extending through the first bending region, the second bending region, and the second region; a second sensor line disposed on the second bending region and between the first sensor line and the second region; and second sensor connection lines electrically connected to the second sensor line, extending through the second bending region and the second region.

The bending region may further include a central bending region disposed between the first bending region and the second bending region.

At least a portion of the first sensor line may extend from the first bending region toward the central bending region, and at least a portion of the second sensor line may extend from the second bending region toward the central bending region.

The display device may further include: a third sensor line disposed on the central bending region; and third sensor connection lines electrically connected to the third sensor line and extending through the central bending region, the second bending region, and the second region.

The bending region may further include: a first sub-central bending region disposed between the first bending region and the central bending region and a second sub-central bending region disposed between the central bending region and the second bending region, wherein at least a portion of the first sensor line may extend from the first bending region toward the first sub-central bending region, wherein at least a portion of the second sensor line may extend from the second bending region toward the second sub-central bending region, wherein a first portion of the third sensor line may extend from the central bending region toward the first sub-central bending region, and wherein a second portion of the third sensor line may be extended from the central bending region toward the second sub-central bending region.

The second sensor connection lines may be disposed between the first sensor connection lines in the second bending region.

The first region, the first bending region, the second bending region, and the second region may be sequentially arranged in a first direction.

Each of the first sensor line and the second sensor line may include: a first bending line extending in the first direction; a connection line extending from an end of the first bending line in a second direction intersecting the first direction; and a second bending line extending from an end of the connection line in the first direction.

Each of the first sensor line and the second sensor line may include: a first bending line extending in a third direction between the first direction and a second direction orthogonal to the first direction; and a second bending line extended from an end of the first bending line in a fourth direction intersecting the third direction.

The first sensor line may include a plurality of first resistor lines and the second sensor line may include a plurality of second resistor lines, wherein the plurality of first resistor lines may be spaced apart from each other, in a second direction crossing the first direction, with the signal lines interposed therebetween, and wherein the plurality of second resistor lines may be spaced apart from each other, in the second direction, with the signal lines interposed therebetween.

The display device may further include: an average sensor line disposed on the first bending region and the second bending region; and average sensor connection lines electrically connected to the average sensor line and extending through the first bending region, the second bending region, and the second region.

The display device may further include a protection film disposed below the first and second regions of the base layer.

The display device may further include a compensation layer disposed on the bending region of the base layer to cover the signal lines, the first sensor line, the second sensor line, the first sensor connection lines, and the second sensor connection lines disposed on the bending region.

The display device may further include a data driver electrically connected to each of the first sensor line and the second sensor line, the data driver configured to sense a change in a property of each of the first sensor line and the second sensor line generated in response to bending detected in the bending region.

The first sensor line may be not overlapped with the second bending region, and the second sensor line may be not overlapped with the first bending region.

According to one or more embodiments of the invention, a display device includes: a base layer including a first region, a second region, and a bending region, the bending region including a first bending region adjacent to the first region and a second bending region adjacent to the second region; pixels disposed on the first region; pads disposed on the second region; signal lines electrically connected to the pixels and disposed on the first region, the bending region, and the second region; a first resistor line disposed on the first bending region, the first resistor line having variable resistance varying depending on the amount of bending of the first bending region; a second resistor line disposed on the second bending region, the second resistor line having a variable resistance varying depending on the amount of bending of the second bending region; an average resistor line disposed on the first bending region and the second bending region, the average resistor line having a variable resistance depending on the amount of bending of the bending region; and a data driver to sense and store a change in resistance of each of the first resistor line, the second resistor line, and the average resistor line generated in response to bending in the bending region.

The bending region may further include a central bending region between the first bending region and the second bending region, the display device may further include a third resistor line disposed on the central bending region, the third resistor line having a variable resistance depending on the amount of bending of the central bending region.

According to one or more embodiments of the invention, a display device includes: a base layer including a display region, a pad region, and a bending region between the display region and the pad region, the bending region including a first bending region adjacent to the display region and a second bending region adjacent to the pad region; a first conductive layer disposed on the base layer; a first insulating layer disposed on the first conductive layer; a second conductive layer disposed on the first insulating layer, the second conductive layer including: a first resistor line disposed on the first bending region, the first resistor line configured to have a resistance varying in response to a bending state of the first bending region; and a second resistor line disposed on the second bending region, the second resistor line configured to have a resistance varying in response to a bending state of the second bending region; and a second insulating layer disposed on the second conductive layer.

In a plan view, the first resistor line may be not overlapped with the second bending region and the second resistor line may be not overlapped with the first bending region.

The second conductive layer may further include first resistor connection lines connected to two opposite ends of the first resistor line, and second resistor connection lines connected to two opposite ends of the second resistor line, wherein each of the first and second resistor connection lines may extend in a first direction, wherein the first resistor line may extend in a second direction crossing the first direction to connect the first resistor connection lines to each other, and wherein the second resistor line may extend in the second direction to connect the second resistor connection lines to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
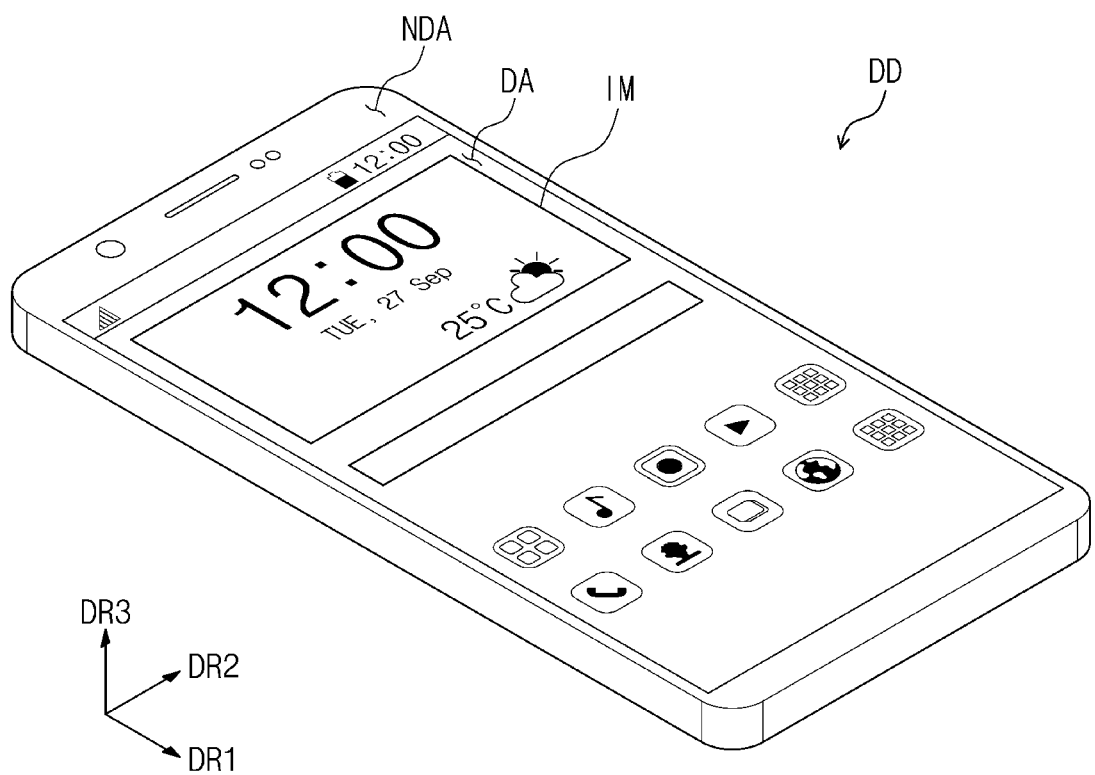
FIG. 1 is a perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, a first direction DR1, a second direction DR2, and a third direction DR3 are not limited to three axes of a rectangular coordinate system, such as the x, y, and z-axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD constructed according to an exemplary embodiment of the invention.

Referring to FIG. 1, a display region DA and a non-display region NDA may be defined in the display device DD.

The display region DA may be used to display an image IM and may be generally parallel to a plane defined by a first direction DR1 and a second direction DR2. A direction normal to the display region DA (e.g., a thickness direction of the display device DD) will be referred to as a third direction DR3. A front surface (or a top surface) and a rear surface (or a bottom surface) of each member may be distinguished, based on the third direction DR3. However, directions indicated by the first, second, and third directions DR1, DR2, and DR3 may be relative concepts, and in some exemplary embodiments, they may be changed to indicate other directions. Hereinafter, first, second, and third directions may be directions indicated by the first, second, and third directions DR1, DR2, and DR3, respectively, and will be referenced with the same numerals.

The display device DD may be used for large-sized electronic devices (e.g., television sets, monitors, and outdoor billboards) or small- or medium-sized electronic devices (e.g., personal computers, notebook computers, personal digital assistants, car navigation systems, game machines, portable electronic devices, and cameras). However, it should be understood that these are merely examples of the invention, and that other electronic devices may be used to realize the invention, unless they do not depart from the invention.

The non-display region NDA may be located adjacent to the display region DA and may not be used to display the image IM. A bezel region of the display device DD may be defined by the non-display region NDA.

The non-display region NDA may be provided to enclose the display region DA. However, the invention is not limited thereto, and the shapes of the display and non-display regions DA and NDA may be variously changed in a mutually influential manner.

Figure 2:
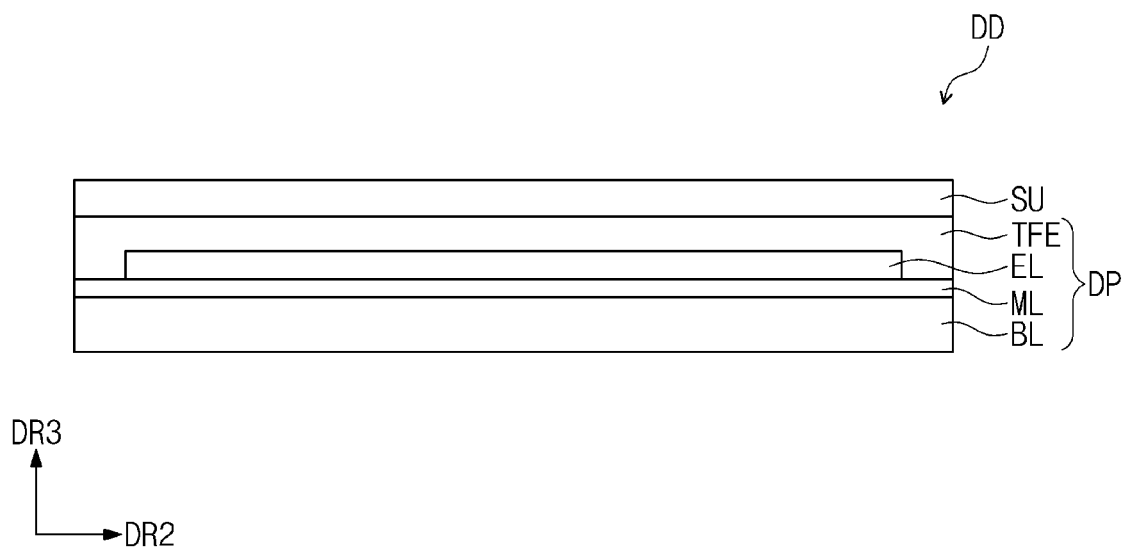
FIG. 2 is a sectional view of a display device constructed according to an exemplary embodiment of the invention.

FIG. 2 is a sectional view illustrating the display device DD according to an exemplary embodiment of the invention.

Referring to FIG. 2, the display device DD may include a display panel DP and a sensing unit SU.

The display panel DP may include a base layer BL, a circuit layer ML, a light-emitting device layer EL, and a thin encapsulation layer TFE. For the sake of simplicity, the description that follows will refer to an example in which the display panel DP includes an organic light emitting display panel, but the invention is not limited thereto.

The base layer BL may be a silicon substrate, a plastic substrate, a glass substrate, an insulating film, or a stack including a plurality of insulating layers.

The circuit layer ML may be disposed on the base layer BL. The circuit layer ML may include a plurality of insulating layers, a plurality of conductive layers, and at least one semiconductor layer.

The light-emitting device layer EL may be disposed on the circuit layer ML. The light-emitting device layer EL may include display devices (e.g., organic light emitting diodes). However, the invention is not limited thereto, and depending on kind of the display panel DP, the light-emitting device layer EL may include inorganic light-emitting diodes or organic-inorganic hybrid light-emitting diodes.

The thin encapsulation layer TFE may be configured to seal the light-emitting device layer EL. The thin encapsulation layer TFE may include a plurality of inorganic layers and at least one organic layer interposed therebetween. The inorganic layer may protect the light-emitting device layer EL from moisture or oxygen, and the organic layer may protect the light-emitting device layer EL from foreign substances (e.g., dust particles). The inorganic layer may be formed of or include at least one of silicon nitride, silicon oxynitride, silicon oxide, titanium oxide, or aluminum oxide. The organic layer may include a polymeric layer (e.g., an acrylic-based organic layer), but the invention is not limited thereto.

In addition, the thin encapsulation layer TFE may further include a buffer layer. The buffer layer may be a layer that is closest to the sensing unit SU. The buffer layer may be an inorganic layer or an organic layer.

The sensing unit SU may include a circuit that is configured to detect a touch event. In the sensing unit SU, a touch event may be detected by various methods (e.g., a resistance-layer method, a photo-sensing method, a capacitance-sensing method, and an ultrasonic wave sensing method), but the invention is not limited thereto. In the sensing unit SU using the capacitance-sensing method, a change in capacitance, which is caused when an object is in touch with the screen of the display device DD, is used to determine whether a touch event occurs. The capacitance-sensing method may be classified into a mutual-capacitance method and a self-capacitance method.

The sensing unit SU may be directly disposed on the display panel DP. In the specification, the expression "be directly disposed" is used to represent that two layers are successively formed one on top of the other, without formation of an additional adhesive layer. However, the invention is not limited thereto, and the display panel DP and the sensing unit SU may be coupled to each other by an adhesive member. In an exemplary embodiment, the sensing unit SU may be omitted.

Figure 3A:
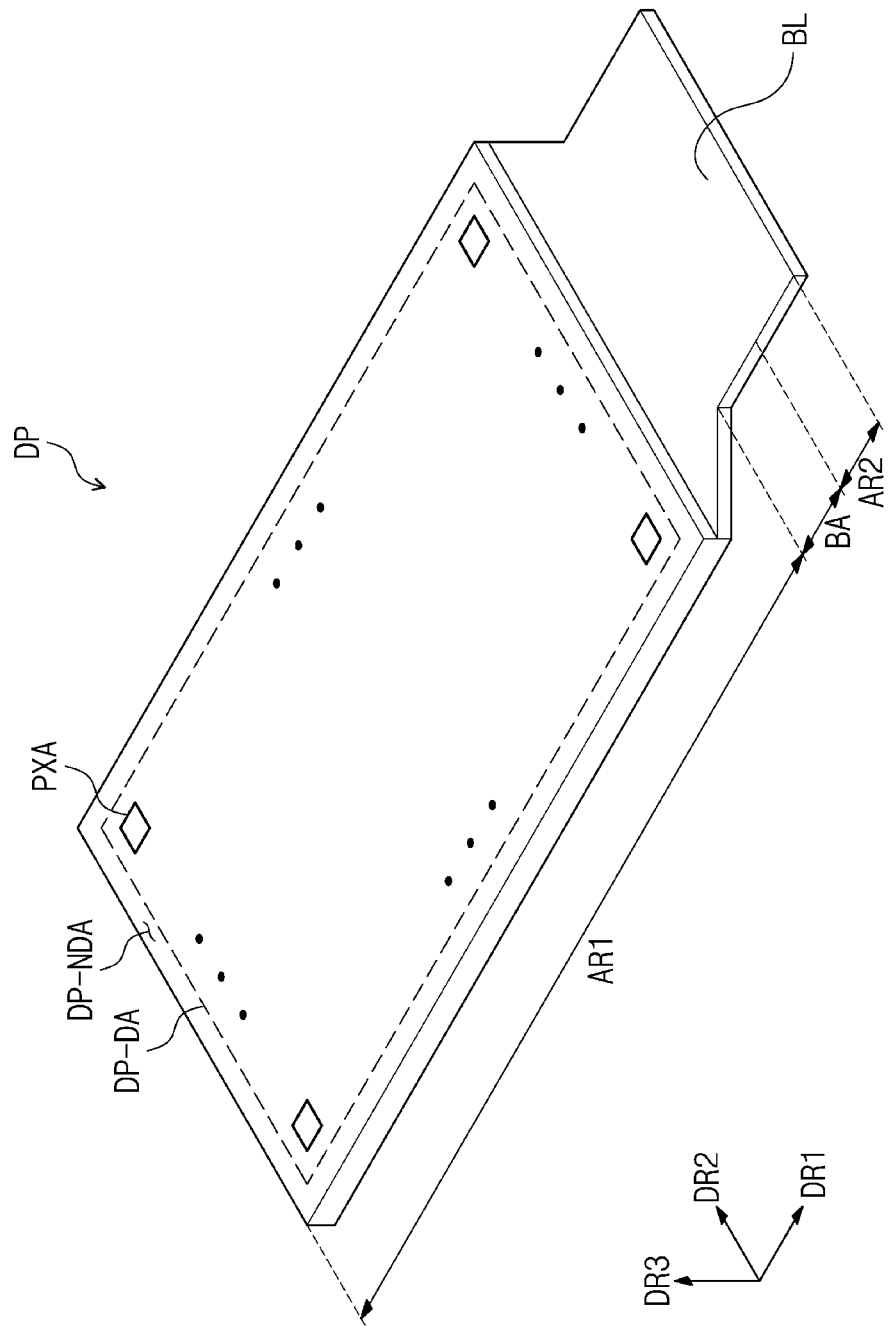
FIGS. 3A and 3B are perspective views illustrating a display panel constructed according to an exemplary embodiment of the invention.
Figure 3B:
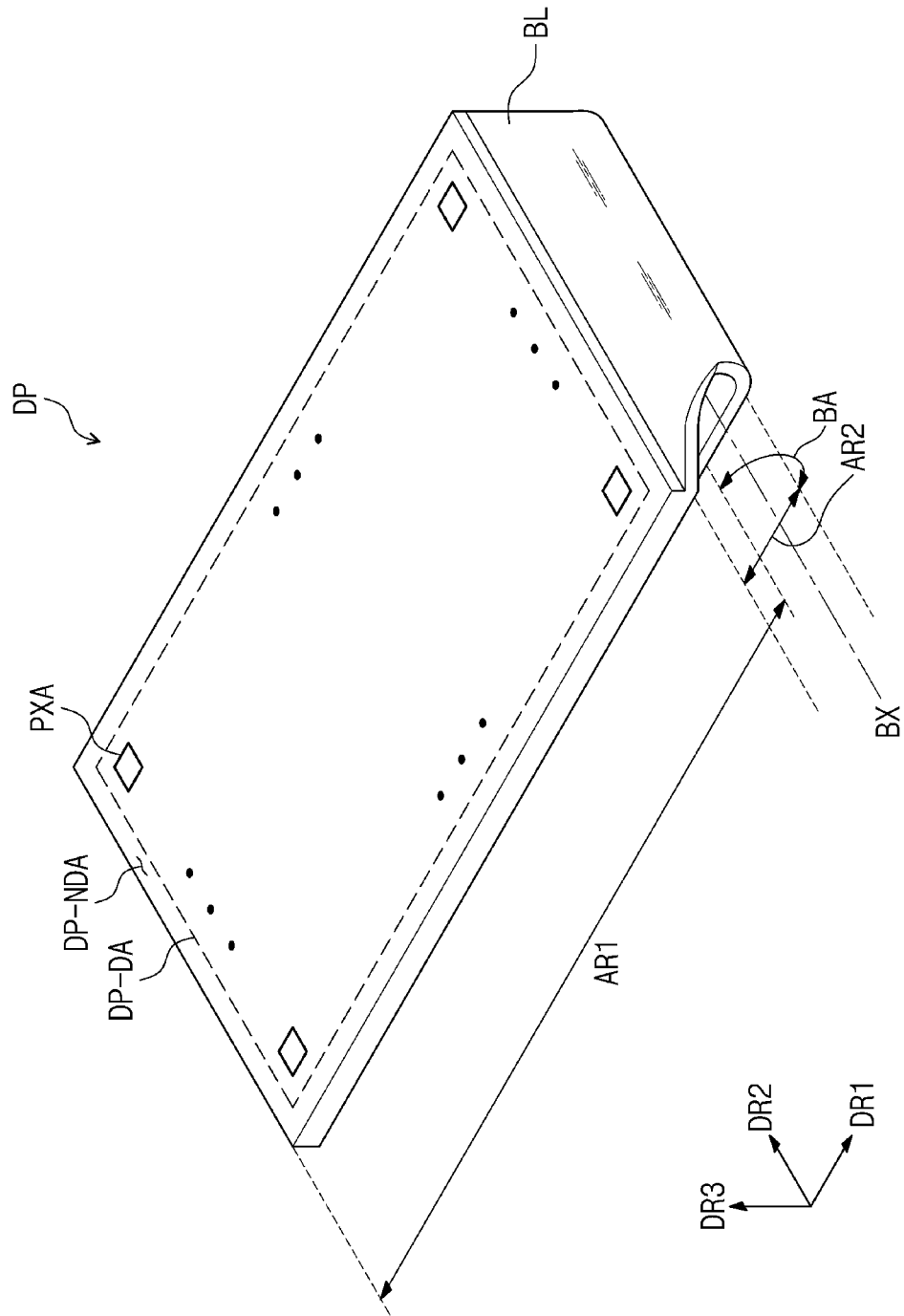

FIGS. 3A and 3B are perspective views illustrating a display panel constructed according to an exemplary embodiment of the invention.

Referring to FIGS. 3A and 3B, at least a portion of the display panel DP may be bent. The base layer BL of the display panel DP may be classified into a plurality of regions, depending on its bending state. For example, the base layer BL of the display panel DP may include a first region AR1, a second region AR2, and a bending region BA. The bending region BA may be defined between the first and second regions AR1 and AR2. The first region AR1, the bending region BA, and the second region AR2 may be arranged in the first direction DR1.

The first region AR1 may be generally parallel to a plane defined by the first and second directions DR1 and DR2. The first region AR1 may include a display region DP-DA and a peripheral region DP-NDA. A display element (e.g., a pixel) displaying an image may be disposed on the display region DP-DA. Thus, a pixel emission region PXA may be defined in the display region DP-DA.

The peripheral region DP-NDA may be adjacent to the display region DP-DA. In the illustrated embodiment, the peripheral region DP-NDA may be disposed along an edge of the display region DP-DA to enclose the display region DP-DA. Meanwhile, in the illustrated embodiment, the peripheral region DP-NDA may include a portion, which is located between the display region DP-DA and the second region BA, and whose width is smaller than the display region DP-DA when measured in the second direction DR2. Thus, a bending area of the display panel DP may be reduced. However, the invention is limited to the above example.

The bending region BA may be defined at a region, whose width in the second direction DR2 is smaller than a width of the first region AR1 in the second direction DR2. The bending region BA may be bent around a bending axis BX generally parallel to the second direction DR2. The bending region BA may have a specific curvature, when the display panel DP is in the bent state.

When the display panel DP is in the bent state, the second region AR2 may face a portion of the first region AR1, in the third direction DR3.

Figure 3C:
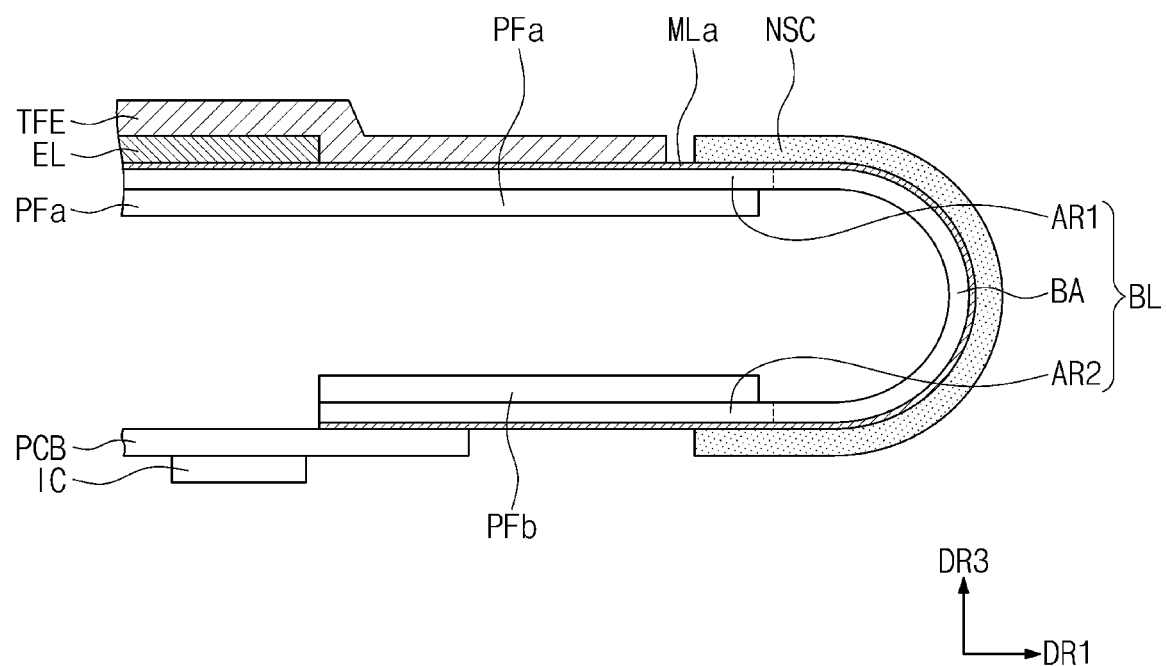
FIG. 3C is a sectional view illustrating a portion of a display panel constructed according to an exemplary embodiment of the invention.

FIG. 3C is a sectional view illustrating a portion of a display panel constructed according to an exemplary embodiment of the invention.

In detail, FIG. 3C is a sectional view of the bending region BA in a bent state.

Referring to FIG. 3C, protection films PFa and PFb may be attached to a rear surface of the base layer BL. The protection films PFa and PFb may include a first protection film PFa, which is attached to the rear surface of the first region AR1 of the base layer BL, and a second protection film PFb, which is attached to the rear surface of the second region AR2.

Each of the first and second protection films PFa and PFb may have a modulus ranging from 1 Gpa to 10 Gpa. For example, the modulus of each of the first and second protection films PFa and PFb may be about 8 Gpa.

In an exemplary embodiment, the first and second protection films PFa and PFb may not be attached to the rear surface of the bending region BA of the base layer BL. Thus, the bending region BA may be easily bent.

In an exemplary embodiment, a cushion layer may be attached to a rear surface of the first protection film PFa. The cushion layer may be configured to absorb an impact exerted from the outside. In an exemplary embodiment, a metal protection layer may be disposed on a rear surface of the first protection film PFa. The metal protection layer may have a rigid property. Due to the presence of the metal protection layer, it may be possible to prevent or reduce waviness from occurring in the base layer BL.

An interconnection layer MLa may be disposed on the top surface of the base layer BL. The interconnection layer MLa may be disposed on all of the first region AR1, the bending region BA, and the second region AR2. The interconnection layer MLa may be at least one metal layer, which may be used as a part of the circuit layer ML (e.g., see FIG. 2).

The protection films PFa and PFb may not be attached to the rear surface of the bending region BA of the base layer BL. Thus, a position of a neutral plane, at which a bending stress is zero, may be changed. In the case where the neutral plane is formed below the interconnection layer MLa, a tensile stress may be exerted on the interconnection layer MLa. If the tensile stress is exerted on the interconnection layer MLa, probability that a crack occurs in the interconnection layer MLa may be increased.

To adjust a position of the neutral plane, a compensation layer NSC may be disposed on the interconnection layer MLa. The compensation layer NSC may be formed of or include a resin. The position of the neutral plane may be controlled by adjusting a thickness and a modulus of the compensation layer NSC. Since the compensation layer NSC is disposed, the neutral plane may be formed in or above the interconnection layer MLa. Thus, a compressive stress may be exerted on the interconnection layer MLa or the bending stress may not be exerted on the interconnection layer MLa. Accordingly, the probability that a crack occurs in the interconnection layer MLa may be reduced.

A printed circuit board PCB may be electrically connected to the second region AR2 of the base layer BL. A data driver IC may be placed on a surface of the printed circuit board PCB. In an exemplary embodiment, the data driver IC may be placed in the second region AR2 of the base layer BL. In other words, the data driver IC may be directly mounted on the display panel DP. The data driver IC may be provided in the form of a driving chip.

Figure 4:
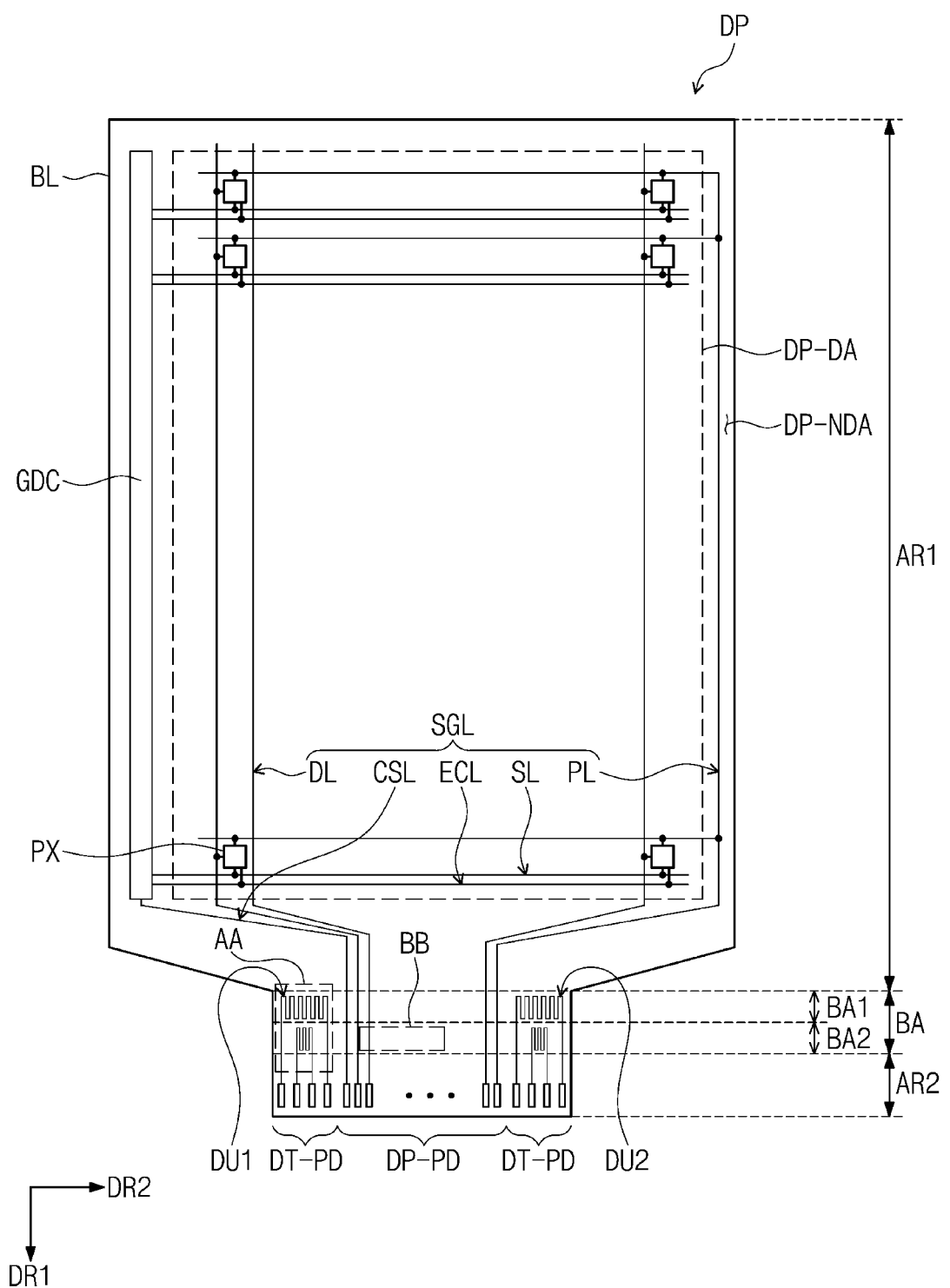
FIG. 4 is a plan view of the display panel of FIG. 3A.

FIG. 4 is a plan view of the display panel DP of FIG. 3A.

Referring to FIG. 4, the display panel DP may include a plurality of pixels PX, a plurality of signal lines SGL, and a driving circuit GDC.

The pixels PX may be disposed on the first region AR1 of the base layer BL. The pixels PX may be disposed on the display region DP-DA of the first region AR1. Each of the pixels PX may be configured to display light having a specific color. The pixels PX may include, for example, red pixels, green pixels, and blue pixels. In an exemplary embodiment, the pixels PX may further include white pixels. In an exemplary embodiment, the pixels PX may further include at least one of cyan pixels, magenta pixels, or yellow pixels.

The driving circuit GDC may be disposed on the peripheral region DP-NDA. The driving circuit GDC may include a scan driving circuit and an emission control driving circuit. The scan driving circuit may be configured to generate a plurality of scan signals and then to sequentially output the generated scan signals to a plurality of scan lines SL to be described below. The emission control driving circuit may be configured to generate emission control signals and then to output the generated emission control signals to emission control lines ECL.

The driving circuit GDC may include a plurality of thin-film transistors that are formed by the same process as that for the pixel driving circuit of the pixels PX (e.g., by a low temperature polycrystalline silicon (LTPS) process or a low temperature polycrystalline oxide (LTPO) process).

The data driver IC (e.g., see FIG. 3C) may be configured to output data signals to data lines DL. The data signals may be disposed in the form of analog voltages, whose levels are determined based on gradation levels of the image data.

In an exemplary embodiment, the data driver IC (e.g., see FIG. 3C) may be mounted on the printed circuit board PCB (e.g., see FIG. 3C). The printed circuit board PCB may be electrically connected to pads DP-PD and DT-PD, which are disposed at ends of the data lines DL. However, the invention is not limited thereto, and in an exemplary embodiment, the data driver IC may be directly mounted on the display panel DP.

The signal lines SGL may include the scan lines SL, the emission control lines ECL, the data lines DL, a power line PL, and a control signal line CSL. The signal lines SGL may be disposed on the first region AR1, the bending region BA, and the second region AR2.

The scan lines SL may be extended in the second direction DR2 and may be arranged in the first direction DR1. The emission control lines ECL may be extended in the second direction DR2 and may be arranged in the first direction DR1. In other words, each of the emission control lines ECL may be disposed generally parallel to a corresponding one of the scan lines SL.

The data lines DL may be extended in the first direction DR1 and may be arranged in the second direction DR2. The data lines DL may be used to provide the data signals to corresponding ones of the pixels PX.

The power line PL may be used to provide a first power to corresponding ones of the pixels PX.

Each of the pixels PX may be coupled to a corresponding one of the scan lines SL, a corresponding one of the emission control lines ECL, a corresponding one of the data lines DL, and the power line PL.

A first resistor unit DU1 and a second resistor unit DU2 may be disposed on the bending region BA. Resistance of each of the first and second resistor units DU1 and DU2 may vary depending on bending of the bending region BA. The first and second resistor units DU1 and DU2 may be spaced apart from each other in the second direction DR2. When viewed in a plan view, the signal lines SGL may be disposed between the first and second resistor units DU1 and DU2. The first resistor unit DU1 will be described in more detail below.

The pads DP-PD and DT-PD may be disposed on the second region AR2. The second region AR2 may also be referred to as a pad region. The pads DP-PD and DT-PD may include first pads DP-PD electrically connected to the signal lines SGL and second pads DT-PD electrically connected to the first and second resistor units DU1 and DU2. The printed circuit board PCB (e.g., see FIG. 3C) may be attached to the first pads DP-PD and the second pads DT-PD. Thus, the data driver IC (e.g., see FIG. 3C) may be electrically connected to the signal lines SGL, the first resistor unit DU1, and the second resistor unit DU2.

The data driver IC may be configured to detect and store a change in resistance of each of the first and second resistor units DU1 and DU2.

Figure 5:
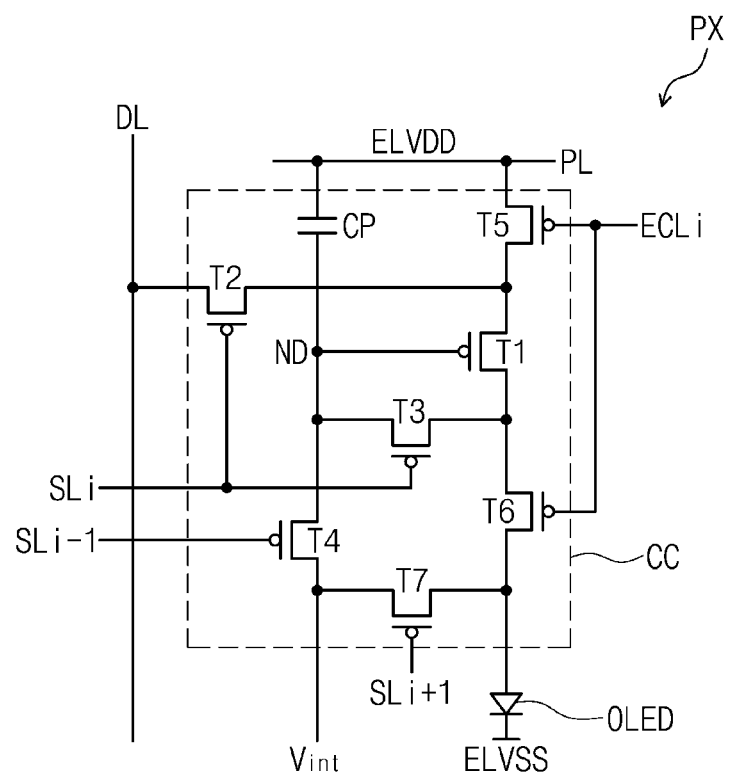
FIG. 5 is an equivalent circuit diagram of a representative pixel constructed according to an exemplary embodiment of the invention.

FIG. 5 is an equivalent circuit diagram of the representative pixel PX according to an exemplary embodiment of the invention. FIG. 5 illustrates the pixel PX connected to an i-th scan line SLi and an i-th emission control line ECLi.

The pixel PX may include an organic light emitting device OLED and a pixel circuit CC. The pixel circuit CC may include a plurality of transistors T1, T2, T3, T4, T5, T6, and T7 and a capacitor CP. The pixel circuit CC may be configured to control an amount of current flowing through the organic light emitting device OLED, in response to the data signal.

The organic light emitting device OLED may be configured to emit light, and here, brightness of the light may be determined by an amount of current to be supplied from the pixel circuit CC. For this, a first power ELVDD may be set to a level higher than that of a second power ELVSS.

Each of the transistors T1, T2, T3, T4, T5, T6, and T7 may include an input or source electrode, an output or drain electrode, and a control or gate electrode. In the specification, for convenience in description, one of the input and output electrodes may be referred to as "a first electrode" and the other may be referred to as "a second electrode".

The first electrode of the first transistor T1 may be coupled to the first power ELVDD through the fifth transistor T5, and the second electrode of the first transistor T1 may be coupled to an anode electrode of the organic light emitting device OLED through the sixth transistor T6. In the specification, the first transistor T1 may be referred to as "a driving transistor".

The first transistor T1 may control an amount of current flowing through the organic light emitting device OLED, in response to a voltage applied to the gate electrode.

The second transistor T2 may be coupled between the data line DL and the first electrode of the first transistor T1. The gate electrode of the second transistor T2 may be coupled to the i-th scan line SLi. If an i-th scan signal is provided to the i-th scan line SLi, the second transistor T2 may be turned on to allow the data line DL to be electrically coupled to the first electrode of the first transistor T1.

The third transistor T3 may be coupled between the second electrode and gate electrode of the first transistor T1. The gate electrode of the third transistor T3 may be coupled to the i-th scan line SLi. If the i-th scan signal is provided to the i-th scan line SLi, the third transistor T3 may be turned on to allow the second and gate electrode of the first transistor T1 to be electrically coupled to each other. Thus, if the third transistor T3 is turned on, the first transistor T1 may behave like a diode.

The fourth transistor T4 may be coupled between a node ND and an initialization power generator. The gate electrode of the fourth transistor T4 may be coupled to an (i−1)-th scan line SLi−1. If an (i−1)-th scan signal is provided to the (i−1)-th scan line SLi−1, the fourth transistor T4 may be turned on to provide an initialization voltage Vint to the node ND.

The fifth transistor T5 may be coupled between the power line PL and the first electrode of the first transistor T1. The gate electrode of the fifth transistor T5 may be coupled to the i-th emission control line ECLi.

The sixth transistor T6 may be coupled between the second electrode of the first transistor T1 and the anode electrode of the organic light emitting device OLED. The gate electrode of the sixth transistor T6 may be coupled to the i-th emission control line ECLi.

The seventh transistor T7 may be coupled between the initialization power generator and the anode electrode of the organic light emitting device OLED. The gate electrode of the seventh transistor T7 may be coupled to an (i+1)-th scan line SLi+1. If an (i+1)-th scan signal is provided to the (i+1)-th scan line SLi+1, the seventh transistor T7 may be turned on to provide the initialization voltage Vint to the anode electrode of the organic light emitting device OLED.

The seventh transistor T7 may be configured to improve a black representation ability of the pixel PX. In detail, if the seventh transistor T7 is turned on, a parasitic capacitor of the organic light emitting device OLED may be discharged. In this case, when it is necessary to represent black, it may be possible to prevent or reduce light from being emitted from the organic light emitting device OLED by a leakage current from the first transistor T1 and thereby to improve the black representation ability of the pixel PX.

In addition, FIG. 5 illustrates an example in which the gate electrode of the seventh transistor T7 is coupled to the (i+1)-th scan line SLi+1, but the invention is not limited thereto. In an exemplary embodiment, the gate electrode of the seventh transistor T7 may be coupled to the i-th scan line SLi or the (i−1)-th scan line SLi−1.

FIG. 5 illustrates an example in which the pixel circuit CC is composed of PMOS transistors, but the invention is not limited thereto. In an exemplary embodiment, the pixel circuit CC may be composed of NMOS transistors. In an exemplary embodiment, the pixel circuit CC may be composed of NMOS and PMOS transistors.

The capacitor CP may be disposed between the power line PL and the node ND. The capacitor CP may be charged to a voltage level corresponding to the data signal. If the fifth and sixth transistors T5 and T6 are turned on, an amount of current flowing through the first transistor T1 may be determined, depending on a voltage level of the capacitor CP.

The invention is not limited to the structure of the pixel PX shown in FIG. 5. In some exemplary embodiments, the circuit structure of the pixel PX may be variously changed to control the light emitting operation of the organic light emitting device OLED.

Figure 6A:
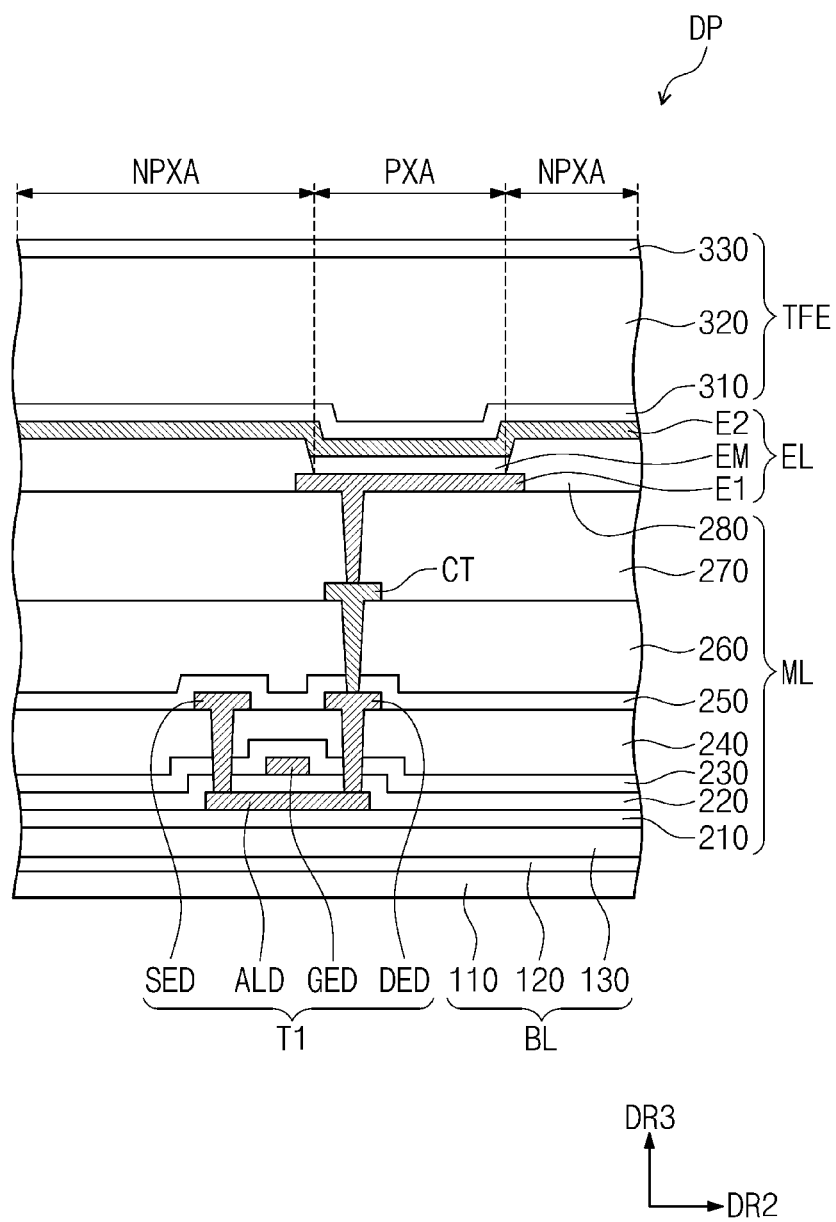
FIG. 6A is a sectional view illustrating a portion of a representative pixel constructed according to an exemplary embodiment of the invention.

FIG. 6A is a sectional view illustrating a portion of a representative pixel PX according to an exemplary embodiment of the invention.

Referring to FIG. 6A, the display panel DP may include the base layer BL, the circuit layer ML, the light-emitting device layer EL, and the thin encapsulation layer TFE.

FIG. 6A illustrates an example in which the base layer BL is a stacking structure including a plurality of insulating layers. However, the invention is not limited to this example, and in an exemplary embodiment, the base layer BL may be a single-layered structure including only one insulating layer.

The base layer BL may include a first base insulating layer 110, a second base insulating layer 120, and a third base insulating layer 130. At least one or all of the first, second, and third base insulating layers 110, 120, and 130 may be formed of or include a material having sufficiently high flexibility. For example, the first base insulating layer 110 and the third base insulating layer 130 may be formed of or include at least one of acrylic resins, methacryl resins, polyisoprene resins, vinyl resins, epoxy resins, urethane resins, cellulose resins, siloxane resins, polyimide resins, polyamide resins, or perylene resins. The second base insulating layer 120 may be formed of or include an inorganic material. For example, the second base insulating layer 120 may include at least one of silicon nitride, silicon oxynitride, silicon oxide, titanium oxide, or aluminum oxide.

A first insulating layer 210 may be disposed on the base layer BL, and a driving transistor T1 may be disposed on the first insulating layer 210. The driving transistor T1 may include a semiconductor pattern ALD, a gate electrode GED, a first electrode SED, and a second electrode DED.

The semiconductor pattern ALD may be disposed on the first insulating layer 210. The first insulating layer 210 may be used as a buffer layer providing a modified surface to the semiconductor pattern ALD. In this case, an adhesion strength between the semiconductor pattern ALD and the first insulating layer 210 may be increased, when compared with the case of directly forming the semiconductor pattern ALD on the base layer BL. In an exemplary embodiment, the first insulating layer 210 may be used as a barrier layer protecting a bottom surface of the semiconductor pattern ALD. In this case, the first insulating layer 210 may prevent or reduce contamination from a material or moisture, which is provided from or through the base layer BL, from entering the semiconductor pattern ALD. In an exemplary embodiment, the first insulating layer 210 may be used as a light-blocking layer preventing or reducing external light, which is incident through the base layer BL, from entering the semiconductor pattern ALD. In this case, the first insulating layer 210 may further include a light-blocking material.

The semiconductor pattern ALD may be formed of or include poly silicon or amorphous silicon. In an exemplary embodiment, the semiconductor pattern ALD may be formed of or include a metal oxide semiconductor material. The semiconductor pattern ALD may include a channel region, which is used as a passage for conduction of electrons or holes, and a first doped region and a second doped region, which are spaced apart from each other with the channel region interposed therebetween.

A second insulating layer 220 may be disposed on the first insulating layer 210 to cover the semiconductor pattern ALD. The second insulating layer 220 may be formed of or include an inorganic material. The gate electrode GED may be disposed on the second insulating layer 220. The inorganic material may include at least one of silicon nitride, silicon oxynitride, silicon oxide, titanium oxide, or aluminum oxide.

A third insulating layer 230 may be disposed on the second insulating layer 220 to cover the gate electrode GED. The third insulating layer 230 may be formed of or include an inorganic material. At least some of the signal lines SGL (e.g., see FIG. 4) may be disposed on the third insulating layer 230.

A fourth insulating layer 240 may be disposed on the third insulating layer 230 to cover at least some of the signal lines SGL (e.g., see FIG. 4). The fourth insulating layer 240 may be formed of or include an inorganic material.

The first electrode SED and the second electrode DED may be disposed on the fourth insulating layer 240. Each of the first electrode SED and the second electrode DED may be connected to the semiconductor pattern ALD through penetration holes, which are formed to penetrate the second insulating layer 220, the third insulating layer 230, and the fourth insulating layer 240.

A fifth insulating layer 250 may be disposed on the fourth insulating layer 240 to cover the first electrode SED and the second electrode DED. The fifth insulating layer 250 may be a passivation layer and may include an inorganic material. In other words, the fifth insulating layer 250 may be formed by depositing an inorganic material.

A sixth insulating layer 260 may be disposed on the fifth insulating layer 250. The sixth insulating layer 260 may have an organic layer or a stacking structure including an organic layer and an inorganic layer. The sixth insulating layer 260 may be provided to have a flat top surface or to serve as a planarization layer.

A third electrode CT may be disposed on the sixth insulating layer 260. The third electrode CT may be coupled to the second electrode DED through a penetration hole penetrating the fifth insulating layer 250 and the sixth insulating layer 260.

A seventh insulating layer 270 may be disposed on the sixth insulating layer 260 to cover the third electrode CT. The seventh insulating layer 270 may have an organic layer or a stacking structure including an organic layer and an inorganic layer. The seventh insulating layer 270 may be provided to have a flat top surface or to serve as a planarization layer.

The light-emitting device layer EL may be disposed on the seventh insulating layer 270. The light-emitting device layer EL may include a first electrode E1, a light emitting layer EM, and a second electrode E2. The first electrode E1 may be disposed on the seventh insulating layer 270 and may be coupled to the third electrode CT through a penetration hole penetrating the seventh insulating layer 270. Since the display panel DP further includes the third electrode CT, even when the first electrode E1 is formed to penetrate a single insulating layer (e.g., the seventh insulating layer 270), the first electrode E1 may be electrically connected to the driving transistor T1.

An eighth insulating layer 280 may be disposed on the seventh insulating layer 270. The eighth insulating layer 280 may be disposed to have an opening exposing a portion of the first electrode E1. The opening of the eighth insulating layer 280 may define the pixel emission region PXA. The eighth insulating layer 280 may be called a pixel definition layer. For example, a plurality of pixels PX (e.g., see FIG. 4) may be regularly arranged on a plane of the display panel DP. A region, in which the pixels PX are provided, may be defined as a pixel region, and each pixel region may include the pixel emission region PXA and a non-emission region NPXA adjacent to the pixel emission region PXA. The non-emission region NPXA may be provided to surround the pixel emission region PXA.

The light emitting layer EM may be disposed on the exposed portion of the first electrode E1. The light emitting layer EM may include a light-emitting material, which emits light when an electrical signal is applied thereto.

The second electrode E2 may be disposed on the light emitting layer EM and the eighth insulating layer 280. The second electrode E2 may be configured to receive the second power ELVSS (e.g., see FIG. 5).

The thin encapsulation layer TFE may be disposed on the second electrode E2. The thin encapsulation layer TFE may directly cover the second electrode E2. In an exemplary embodiment, a capping layer may be further disposed between the thin encapsulation layer TFE and the second electrode E2 to cover the second electrode E2. In this case, the thin encapsulation layer TFE may directly cover the capping layer.

The thin encapsulation layer TFE may include a first inorganic layer 310, an organic layer 320, and a second inorganic layer 330, which are sequentially stacked on the light-emitting device layer EL. The organic layer 320 may be disposed on the first inorganic layer 310. The first inorganic layer 310 and the second inorganic layer 330 may be formed by depositing an inorganic material, and the organic layer 320 may be formed by depositing, printing, or coating an organic material.

FIG. 6A illustrates an example in which the thin encapsulation layer TFE includes two inorganic layers and one organic layer, but the invention is not limited to this example. For example, the thin encapsulation layer TFE may be configured to include three inorganic layers and two organic layers, and in this case, the inorganic layers and the organic layers may be alternately stacked.

Figure 6B:
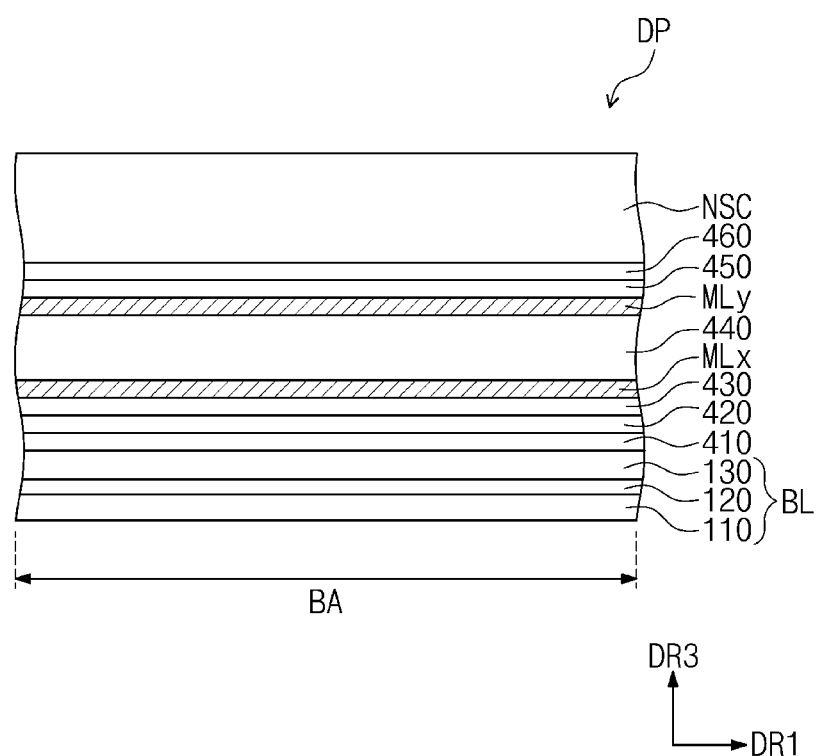
FIG. 6B is a sectional view illustrating a portion of a display panel constructed according to an exemplary embodiment of the invention.

FIG. 6B is a sectional view illustrating a portion of the display panel DP according to an exemplary embodiment of the invention. Particularly, FIG. 6B may be a sectional view schematically illustrating elements stacked on the bending region BA of the base layer BL.

Referring to FIGS. 6A and 6B, a first insulating layer 410, a second insulating layer 420, and a third insulating layer 430 may be stacked on the base layer BL. The first insulating layer 410 may be the same layer as the first insulating layer 210 of FIG. 6A, the second insulating layer 420 may be the same layer as the second insulating layer 220 of FIG. 6A, and the third insulating layer 430 may be the same layer as the third insulating layer 230 of FIG. 6A. However, this is just an example, and at least one of the first insulating layer 410, the second insulating layer 420, and the third insulating layer 430 may be omitted. For example, the first insulating layer 410 and the second insulating layer 420 may not be disposed on the bending region BA. Thus, the third insulating layer 430 may be directly disposed on the bending region BA of the base layer BL.

A first interconnection layer MLx may be disposed on the third insulating layer 430. The first interconnection layer MLx may include at least some of the signal lines SGL (e.g., see FIG. 4).

A fourth insulating layer 440 may be disposed on the first interconnection layer MLx. The fourth insulating layer 440 may be the same layer as the fourth insulating layer 240 of FIG. 6A.

A second interconnection layer MLy may be disposed on the fourth insulating layer 440. The second interconnection layer MLy may include the rest of the signal lines SGL other than the at least some of the signal lines SGL of the first interconnection layer MLx (e.g., see FIG. 4), the first resistor unit DU1 (e.g., see FIG. 4), and the second resistor unit DU2 (e.g., see FIG. 4).

The second interconnection layer MLy may be spaced farther away from the bending axis BX (e.g., see FIG. 3B) than the first interconnection layer MLx. Thus, when the bending region BA is bent, a tensile stress exerted on the second interconnection layer MLy may be greater than a tensile stress exerted on the first interconnection layer MLx. Accordingly, when the bending region BA is bent, a change in resistance of the second interconnection layer MLy may be larger than that of the first interconnection layer MLx. Since the first and second resistor units DU1 and DU2 (e.g., see FIG. 4) includes the second interconnection layer MLy, the change in resistance may be more easily measured.

A fifth insulating layer 450 may be disposed on the second interconnection layer MLy, and a sixth insulating layer 460 may be disposed on the fifth insulating layer 450. The fifth insulating layer 450 may be the same layer as the fifth insulating layer 250 of FIG. 6A, and the sixth insulating layer 460 may be the same layer as the sixth insulating layer 260 of FIG. 6A. However, the invention is not limited to this example, and in an exemplary embodiment, at least one of the fifth and sixth insulating layers 450 and 460 may be omitted.

The compensation layer NSC may be disposed on the sixth insulating layer 460. The compensation layer NSC may be formed of or include a resin. A thickness and a modulus of the compensation layer NSC may be adjusted to control a position of the neutral plane.

Figure 7:
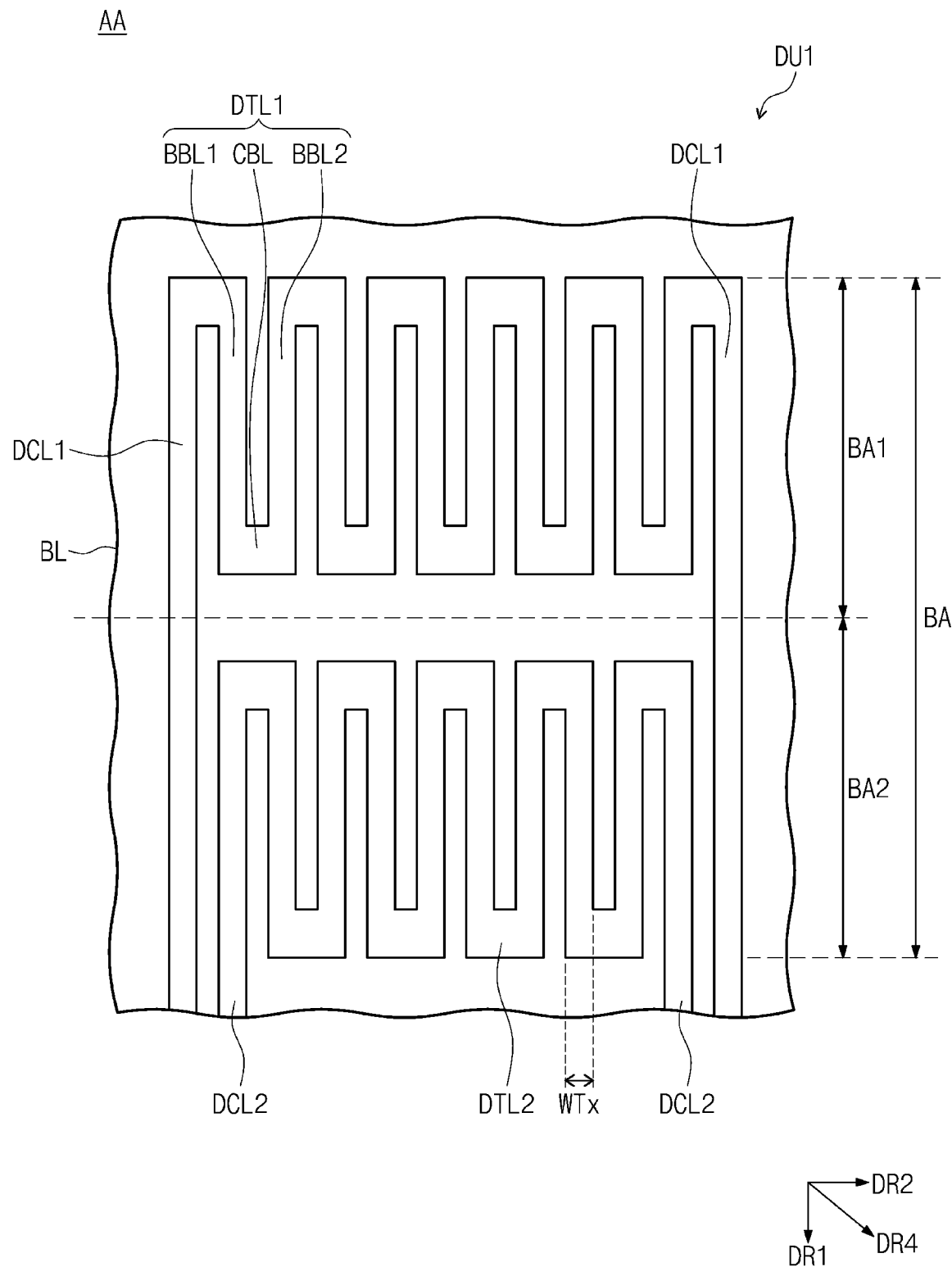
FIG. 7 is an enlarged plan view illustrating a region 'AA' of FIG. 4.

FIG. 7 is an enlarged plan view illustrating a region 'AA' of FIG. 4.

Referring to FIGS. 4 and 7, the bending region BA may be divided into a first bending region BA1 and a second bending region BA2. The first bending region BA1 may be a region adjacent to the first region AR1, and the second bending region BA2 may be a region adjacent to the second region AR2. In other words, the first region AR1, the first bending region BA1, the second bending region BA2, and the second region AR2 may be sequentially defined in the first direction DR1.

The first and second resistor units DU1 and DU2 may be disposed on the first and second bending regions BA1 and BA2.

The first resistor unit DU1 may include a first resistor line DTL1, a second resistor line DTL2, first resistor connection lines DCL1, and second resistor connection lines DCL2.

The first resistor line DTL1 may be disposed on the first bending region BA1, and the second resistor line DTL2 may be disposed on the second bending region BA2. The second resistor line DTL2 may be disposed between the first resistor line DTL1 and the second region AR2. In a plan view, the first resistor line DTL1 may not be overlapped with the second bending region BA2, and the second resistor line DTL2 may not be overlapped with the first bending region BA1. In other words, a change in a bending state of the first bending region BA1 may lead to a change in resistance of the first resistor line DTL1, and a change in a bending state of the second bending region BA2 may lead to a changed in resistance of the second resistor line DTL2.

The first and second resistor lines DTL1 and DTL2 each may act as a strain gauge. Each of the first and second resistor lines DTL1 and DTL2 may have a serpentine pattern. For example, each of the first and second resistor lines DTL1 and DTL2 may include a first bending line BBL1, a second bending line BBL2, and a connection line CBL. Each of the first and second bending lines BBL1 and BBL2 may be extended in the first direction DR1. The first and second bending lines BBL1 and BBL2 may be spaced apart from each other in the second direction DR2. The connection line CBL may connect the first and second bending lines BBL1 and BBL2 to each other in a generally U-shaped configuration. For example, the connection line CBL may be extended in the second direction DR2 from an end of the first bending line BBL1, and the second bending line BBL2 may be extended in the first direction DR1 from an end of the connection line CBL.

In an exemplary embodiment, the connection line CBL may be extended in a direction crossing the first and second directions DR1 and DR2, for example, in a fourth direction DR4 between the first and second directions DR1 and DR2.

The first resistor connection lines DCL1 may be connected to the first resistor line DTL1. For example, a pair of the first resistor connection lines DCL1 may be connected to the first resistor line DTL1. Here, one of the first resistor connection lines DCL1 may be connected to an end of the first resistor line DTL1, and the other of the first resistor connection lines DCL1 may be connected to an opposite end of the first resistor line DTL1.

The first resistor connection lines DCL1 may be extended from the first bending region BA1 toward the second region AR2. In other words, the first resistor connection lines DCL1 may be disposed on the first bending region BA1, the second bending region BA2, and the second region AR2. The first resistor connection lines DCL1 may be electrically connected to respective ones of the second pads DT-PD (e.g., see FIG. 4) in a one-to-one manner.

The second resistor connection lines DCL2 may be connected to the second resistor line DTL2. For example, one of the second resistor connection lines DCL2 may be connected to an end of the second resistor line DTL2, and another of the second resistor connection lines DCL2 may be connected to an opposite end of the second resistor line DTL2.

The second resistor connection lines DCL2 may be extended from the second bending region BA2 toward the second region AR2. The second resistor connection lines DCL2 may be electrically connected to respective ones of the second pads DT-PD in a one-to-one manner.

A test voltage may be received from at least some of the second pads DT-PD. The test voltage may be reduced, due to a voltage drop through the first resistor line DTL1 and the first resistor connection lines DCL1. In the specification, the reduced test voltage will be referred to as a resultant voltage. The resultant voltage may be transferred to the data driver IC (e.g., see FIG. 3C) through at least others of the second pads DT-PD. In the case where resistances of the first resistor line DTL1 and the first resistor connection lines DCL1 are changed, a voltage difference between the test voltage and the resultant voltage may be changed.

All of the first resistor line DTL1, the second resistor line DTL2, the first resistor connection lines DCL1, and the second resistor connection lines DCL2 may be disposed on the same layer. For example, the first resistor line DTL1, the second resistor line DTL2, the first resistor connection lines DCL1, and the second resistor connection lines DCL2 may be disposed in the second interconnection layer MLy of FIG. 6B. The second resistor connection lines DCL2 may be disposed between the first resistor connection lines DCL1 in the second bending region BA2. Furthermore, a total length of the first resistor line DTL1 may be longer than a total length of the second resistor line DTL2.

In an exemplary embodiment, at least one of the first and second resistor connection lines DCL1 and DCL2 may be disposed in the first interconnection layer MLx of FIG. 6B. In this case, when viewed in a plan view, the first resistor connection lines DCL1 and the second resistor connection lines DCL2 may be overlapped with each other. Furthermore, a total length of the first resistor line DTL1 may be substantially the same as a total length of the second resistor line DTL2. For example, in the case where the first resistor connection lines DCL1 are disposed in the first interconnection layer MLx, a penetration hole may be provided to penetrate the fourth insulating layer 440 (e.g., see FIG. 6B) between the first resistor connection lines DCL1 and the first resistor line DTL1, and the first resistor connection lines DCL1 and the first resistor line DTL1 may be electrically connected to each other through the penetration hole.

According to an exemplary embodiment of the invention, the bending region BA may be divided into a plurality of bending regions (e.g., BA1 and BA2), and a resistor line may be disposed on each of the divided bending regions (e.g., BA1 and BA2). Thus, it may be possible to detect a change in resistance for each bending region. This may make it possible to more precisely determine whether there is a bending failure and to improve product reliability. The first resistor line DTL1, the second resistor line DTL2, the first resistor connection lines DCL1, and the second resistor connection lines DCL2 may be referred to as a first sensor line DTL1, a second sensor line DTL2, first sensor connection lines DCL1, and second sensor connection lines DCL2.

The first and second resistor lines DTL1 and DTL2 may be provided in plural. Here, one of the first resistor lines DTL1 and one of the second resistor lines DTL2 may be included in the first resistor unit DU1, and another of the first resistor lines DTL1 and another of the second resistor lines DTL2 may be included in the second resistor unit DU2. The second resistor unit DU2 may have substantially the same shape as the first resistor unit DU1, and thus, an overlapping description of the second resistor unit will be omitted to avoid redundancy.

Figure 8:
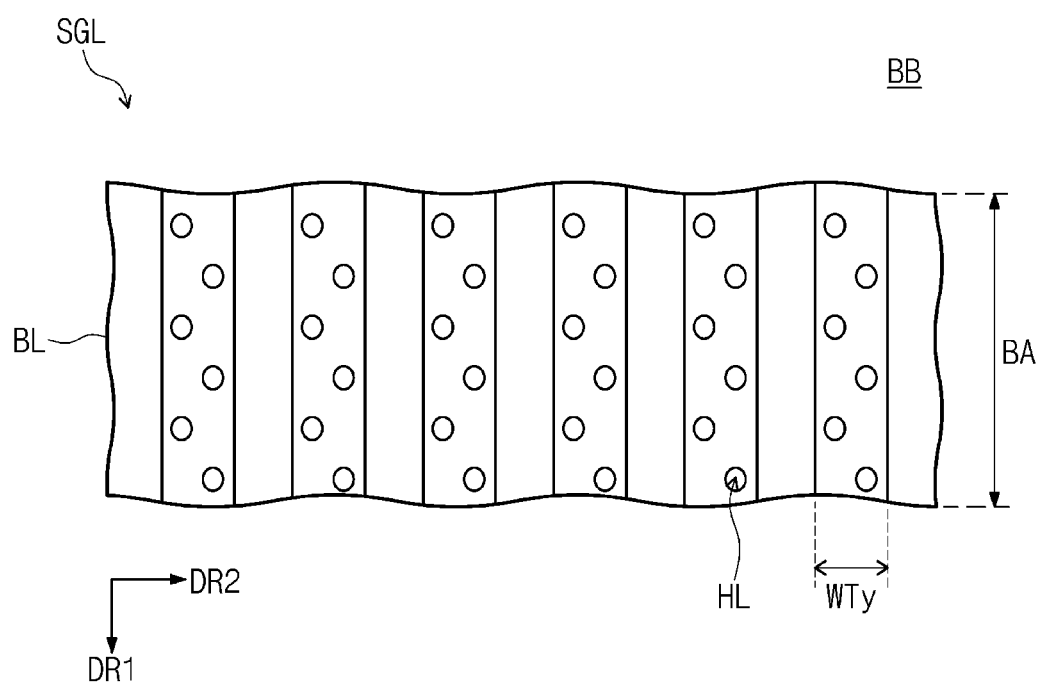
FIG. 8 is an enlarged plan view illustrating a region 'BB' of FIG. 4.

FIG. 8 is an enlarged plan view illustrating a region 'BB' of FIG. 4.

FIG. 8 illustrates enlarged shapes of some of the signal lines SGL. Referring to FIGS. 4 and 8, each of the signal lines SGL may be disposed in the first interconnection layer MLx or the second interconnection layer MLy of FIG. 6B.

When measured in the second direction DR2, a width WTy of one of the signal lines SGL may be larger than a width WTx of the first bending line BBL1 of the first resistor line DTL1 of FIG. 7, which is extended in the first direction DR1. For example, the width WTx of the first bending line BBL1 may be 3 μm, and the width WTy of the signal lines SGL may be 10 μm. In other words, the width WTy of each signal line may be larger than three times the width WTx of the first bending line BBL1.

A plurality of holes HL may be provided in each of the signal lines SGL in the bending region BA. Even when crack occurs in the signal lines SGL, the holes HL may prevent or limit the crack from propagating. Thus, product reliability may be improved.

Figure 9:
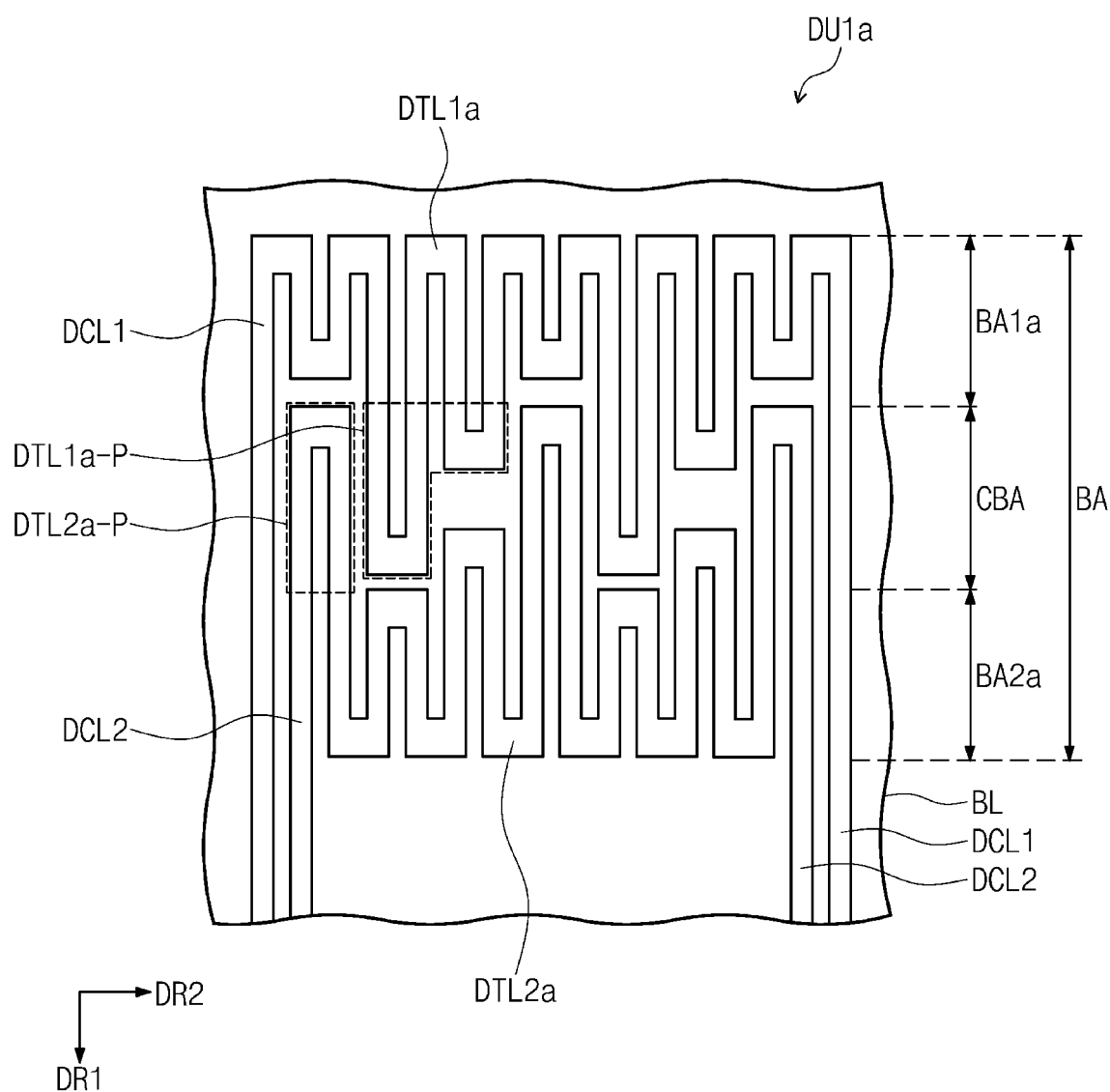
FIG. 9 is an enlarged plan view illustrating a portion of a display panel constructed according to an exemplary embodiment of the invention.

FIG. 9 is an enlarged plan view illustrating a portion of a display panel constructed according to an exemplary embodiment of the invention. FIG. 9 illustrates a region corresponding to the region "AA" of FIG. 4.

Referring to FIGS. 4 and 9, the bending region BA of the base layer BL may include a first bending region BA1a, a second bending region BA2a, and a central bending region CBA.

The first bending region BA1a may be a region adjacent to the first region AR1, the second bending region BA2a may be a region adjacent to the second region AR2, and the central bending region CBA may be a region between the first bending region BA1a and the second bending region BA2a.

A portion DTL1a-P of a first resistor line DTL1a may be extended from the first bending region BA1 toward the central bending region CBA, and a portion DTL2a-P of a second resistor line DTL2a may be extended from the second bending region BA2 toward the central bending region CBA.

Thus, both of the portion DTL1a-P of the first resistor line DTL1a and the portion DTL2a-P of the second resistor line DTL2a may be disposed on the central bending region CBA.

The second resistor unit may have substantially the same shape as the first resistor unit DU1a, and thus, an overlapping description of the second resistor unit will be omitted to avoid redundancy.

Figure 10:
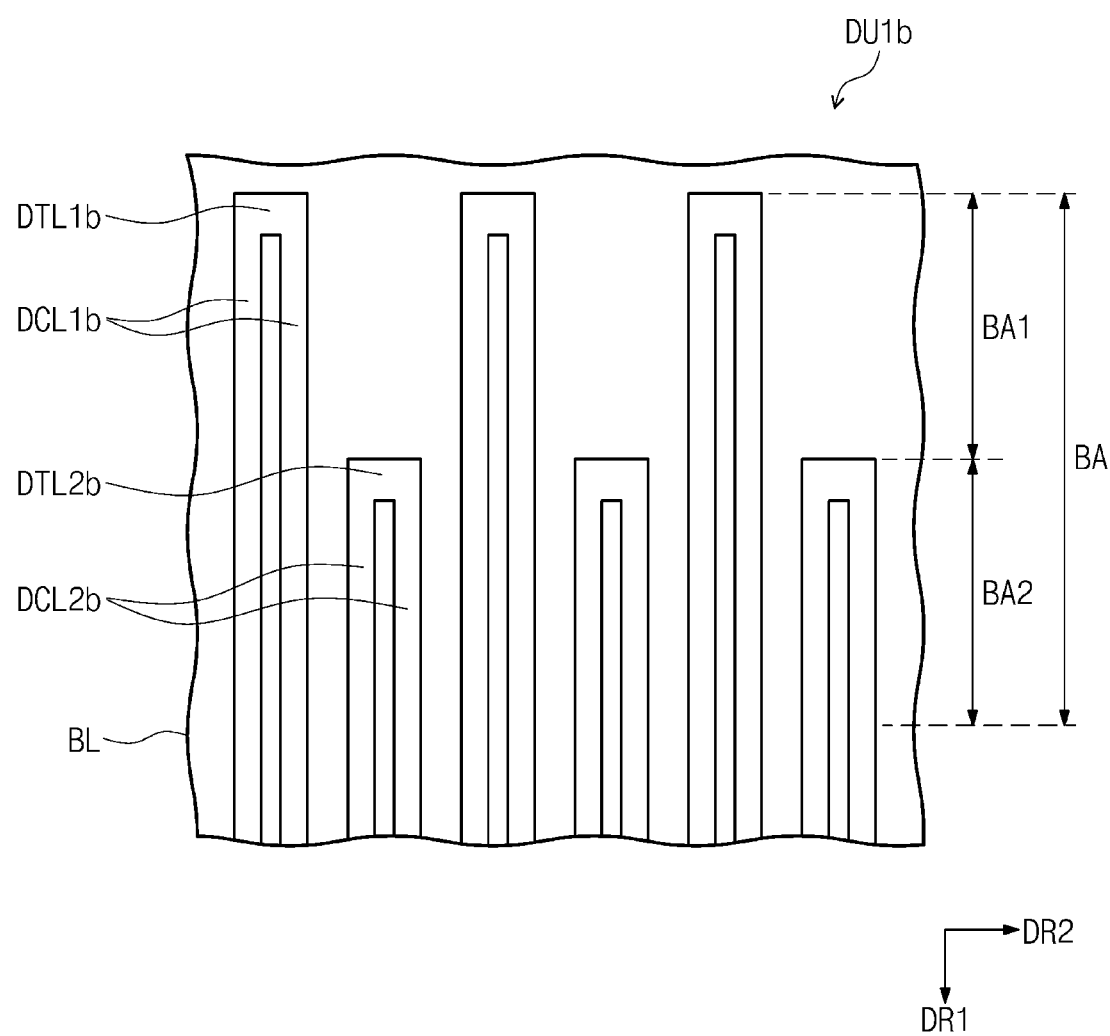
FIG. 10 is an enlarged plan view illustrating a portion of a display panel constructed according to an exemplary embodiment of the invention.

FIG. 10 is an enlarged plan view illustrating a portion of a display panel constructed according to an exemplary embodiment of the invention. FIG. 10 illustrates a region corresponding to the region "AA" of FIG. 4.

Referring to FIG. 10, a first resistor unit DU1b may include a first resistor line DTL1b, first resistor connection lines DCL1b, a second resistor line DTL2b, and second resistor connection lines DCL2b.

The first resistor connection lines DCL1b may be extended in the first direction DR1, and the first resistor line DTL1b may be extended in the second direction DR2 crossing the first direction DR1. The first resistor line DTL1b may connect a pair of the first resistor connection lines DCL1b to each other.

The second resistor connection lines DCL2b may be extended in the first direction DR1, and the second resistor line DTL2b may be extended in the second direction DR2. The second resistor line DTL2b may connect a pair of the second resistor connection lines DCL2b to each other.

According to the exemplary embodiment of FIG. 10, as the base layer BL is bent, a change in resistance of the first and second resistor connection lines DCL1b and DCL2b may be greater than that of the first and second resistor lines DTL1b and DTL2b.

As a bending state of the entire bending region BA is changed, resistance of the first resistor connection lines DCL1b and the first resistor line DTL1b may be changed. As a bending state of the second bending region BA2 is changed, resistance of the second resistor connection lines DCL2b and the second resistor line DTL2b may be changed. In this case, a resistance change caused by the bending of the first bending region BA1 may be determined by subtracting a change in resistance of the second resistor connection lines DCL2b and the second resistor line DTL2b from a change in resistance of the first resistor connection lines DCL1b and is the first resistor line DTL1b.

The second resistor unit may have substantially the same shape as the first resistor unit DU1b, and thus, an overlapping description of the second resistor unit will be omitted to avoid redundancy.

Figure 11:
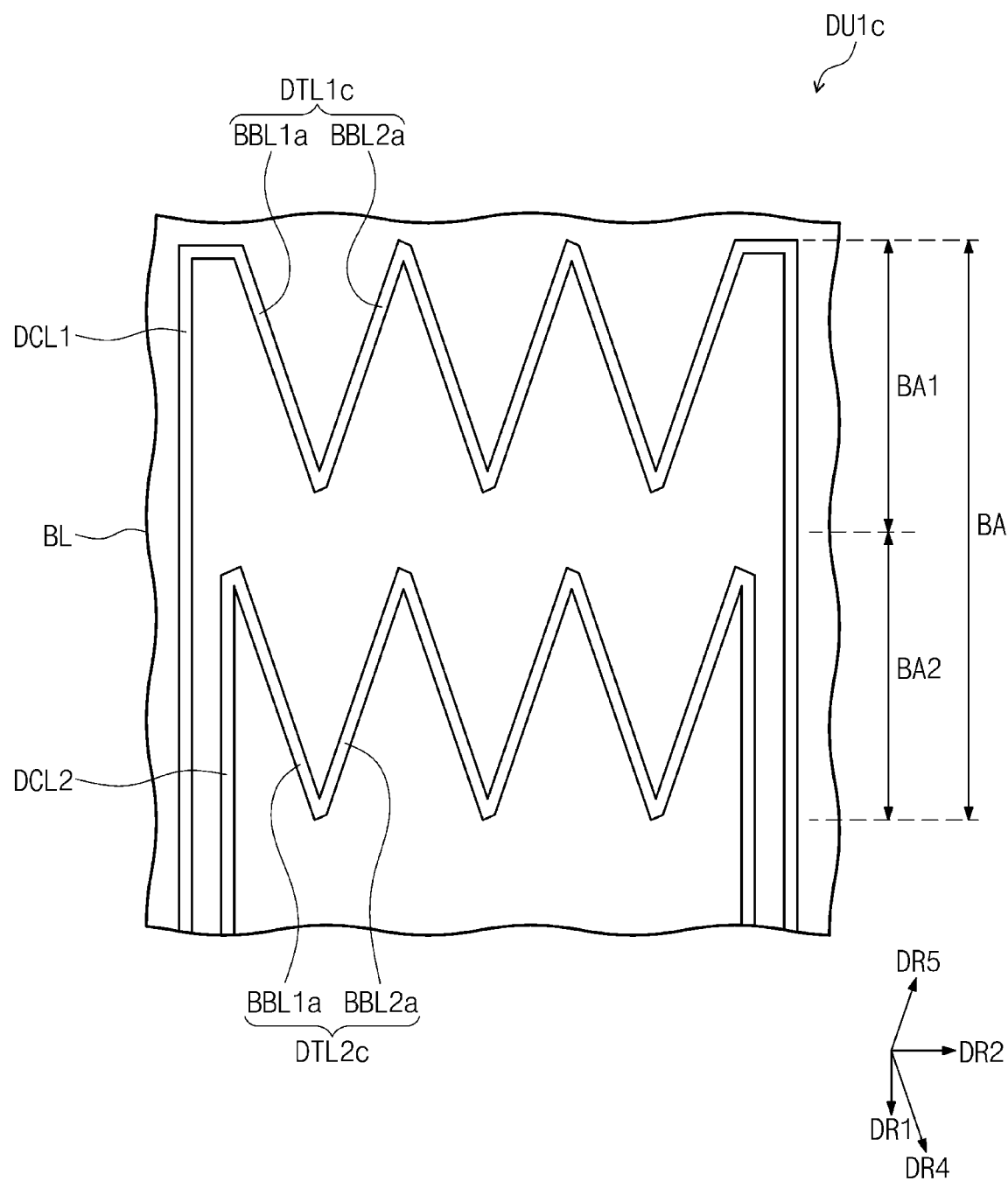
FIG. 11 is an enlarged plan view illustrating a portion of a display panel constructed according to an exemplary embodiment of the invention.

FIG. 11 is an enlarged plan view illustrating a portion of a display panel constructed according to an exemplary embodiment of the invention. FIG. 11 illustrates a region corresponding to the region "AA" of FIG. 4.

Referring to FIG. 11, a first resistor unit DU1c may include a first resistor line DTL1c, first resistor connection lines DCL1, a second resistor line DTL2c, and second resistor connection lines DCL2.

Each of the first resistor line DTL1c and the second resistor line DTL2c may have a zig-zag (sinusoidal) type pattern. For example, each of the first resistor line DTL1c and the second resistor line DTL2c may include a first bending line BBL1a and a second bending line BBL2a. The first bending line BBL1a may be extended in the fourth direction DR4 between the first and second directions DR1 and DR2, and the second bending line BBL2a may be extended from an end of the first bending line BBL1a in a fifth direction DR5 crossing the fourth direction DR4.

The second resistor unit may have substantially the same shape as the first resistor unit DU1c, and thus, an overlapping description of the second resistor unit will be omitted to avoid redundancy.

Figure 12:
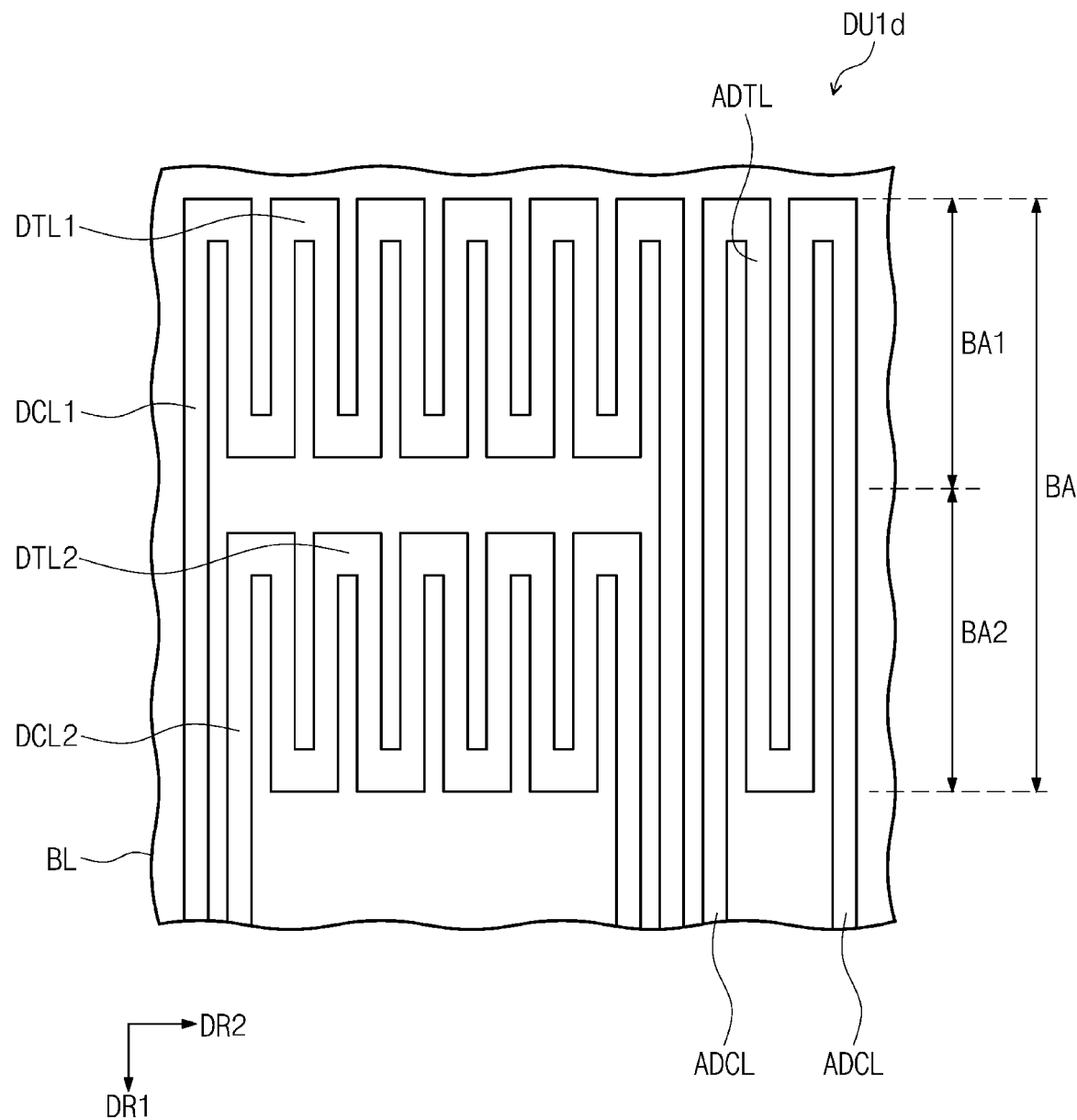
FIG. 12 is an enlarged plan view illustrating a portion of a display panel constructed according to an exemplary embodiment of the invention.

FIG. 12 is an enlarged plan view illustrating a portion of a display panel constructed according to an exemplary embodiment of the invention. FIG. 12 illustrates a region corresponding to the region "AA" of FIG. 4.

When compared with the structure of FIG. 7, a first resistor unit DU1d may further include an average resistor line ADTL and average resistor connection lines ADCL. The average resistor line ADTL and the average resistor connection lines ADCL may be referred to as an average sensor line ADTL and average sensor connection lines ADCL.

The average resistor line ADTL may be disposed on the first bending region BA1 and the second bending region BA2. One of the average resistor connection lines ADCL may be connected to one end of the average resistor line ADTL, and another of the average resistor connection lines ADCL may be connected to an opposite end of the average resistor line ADTL.

As a bending state of the entire bending region BA is changed, resistance values of the average resistor line ADTL and the average resistor connection lines ADCL may be changed. A change in resistance values of the average resistor line ADTL and the average resistor connection lines ADCL may be used to determine whether there is a bending failure and to determine a change in tensile stress caused by a thickness of the compensation layer NSC (e.g., see FIG. 3C).

The second resistor unit may have substantially the same shape as the first resistor unit DU1d, and thus, an overlapping description of the second resistor unit will be omitted to avoid redundancy.

The data driver IC (e.g., see FIG. 3C) may be configured to sense a change in resistance of the first resistor line DTL1, which is caused by a change in a bending state of the first bending region BA1, a change in resistance of the second resistor line DTL2, which is caused by a change in a bending state of the second bending region BA2, and a change in resistance of the average resistor line ADTL, which is caused by a change in a bending state of the entire bending region BA, and the resistance changing values may be stored in the data driver IC. Thus, after the bending, the resistance changing values stored in the data driver IC may be used to determine whether there is a bending failure.

Figure 13:
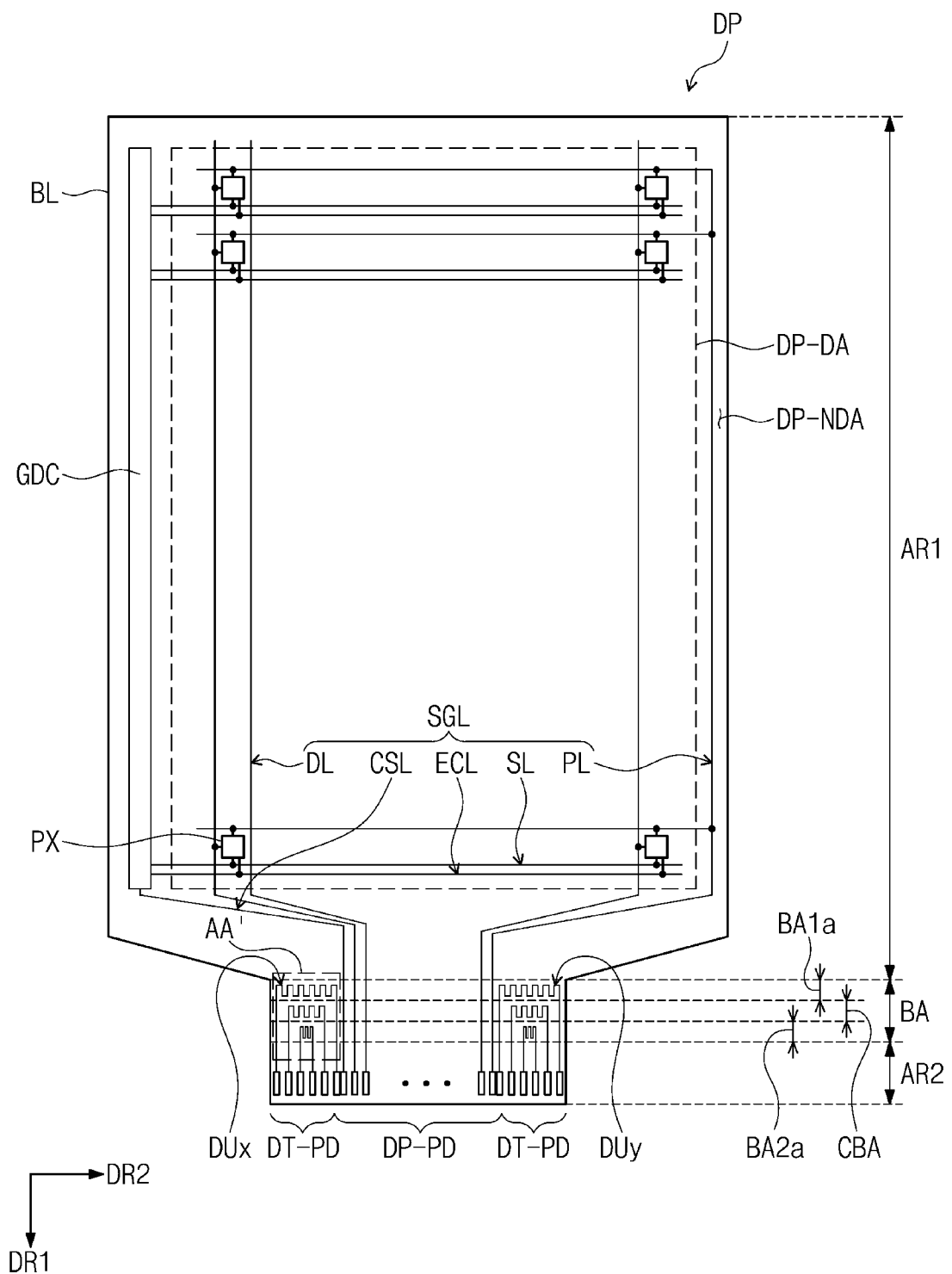
FIG. 13 is a plan view illustrating the display panel shown in FIG. 3A.

FIG. 13 is a plan view illustrating the display panel shown in FIG. 3A.

Referring to FIG. 13, the bending region BA of the base layer BL may include the first bending region BA1$a$, the second bending region BA2$a$, and the central bending region CBA.

The first bending region BA1$a$ may be a region adjacent to the first region AR1, the second bending region BA2$a$ may be a region adjacent to the second region AR2, the central bending region CBA may be a region between the first bending region BA1$a$ and the second bending region BA2$a$.

A first resistor unit DUx and a second resistor unit DUy may be disposed on the bending region BA. Resistance of each of the first resistor unit DUx and the second resistor unit DUy may vary depending on bending of the bending region BA. The first resistor unit DUx and the second resistor unit DUy may be spaced apart from each other in the second direction DR2. When viewed in a plan view, the signal lines SGL may be disposed between the first resistor unit DUx and the second resistor unit DUy. The first resistor unit DUx will be described in more detail below.

Figure 14:
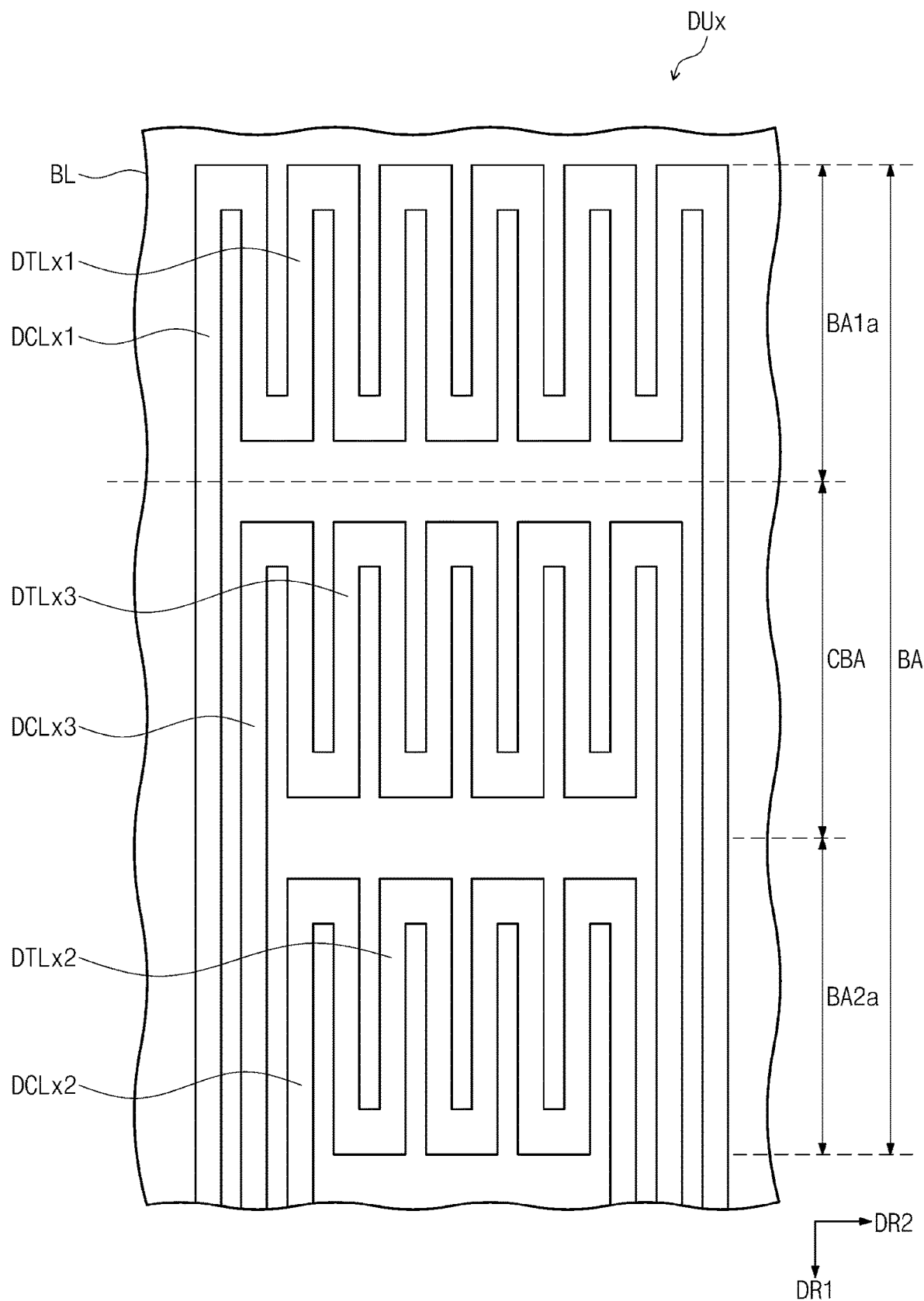
FIG. 14 is an enlarged plan view illustrating a region 'AA' of FIG. 13.

FIG. 14 is an enlarged plan view illustrating a region 'AA' of FIG. 13.

The first resistor unit Dux may include a first resistor line DTLx1, a second resistor line DTLx2, a third resistor line DTLx3, first resistor connection lines DCLx1, second resistor connection lines DCLx2, and third resistor connection lines DCLx3. The third resistor line DTLx3 and the third resistor connection lines DCLx3 may be referred to as a third sensor connection lines DCLx3 and third sensor connection lines DCLx3.

The first resistor line DTLx1 may be disposed on the first bending region BA1$a$, the second resistor line DTLx2 may be disposed on the second bending region BA2$a$, and the third resistor line DTLx3 may be disposed on the central bending region CBA. When viewed in a plan view, the first resistor line DTL1$x$1 may not be overlapped with the central bending region CBA and the second bending region BA2$a$, the second resistor line DTLx2 may not be overlapped with the first bending region BA1$a$ and the central bending region CBA, and the third resistor line DTLx3 may not be overlapped with the first bending region BA1$a$ and the second bending region BA2$a$.

As the bending region BA is bent, resistance of each of the first resistor line DTLx1, the second resistor line DTLx2, the third resistor line DTLx3, the first resistor connection lines DCLx1, the second resistor connection lines DCLx2, and the third resistor connection lines DCLx3 may be changed.

Based on the change in resistance of each of the first resistor line DTLx1, the second resistor line DTLx2, the third resistor line DTLx3, the first resistor connection lines DCLx1, the second resistor connection lines DCLx2, and the third resistor connection lines DCLx3, the data driver IC (e.g., see FIG. 3C) may determine whether there is a bending failure.

According to an exemplary embodiment of the invention, a change in resistance of a resistor line disposed on each bending region may be sensed to determine whether there is a bending failure in each bending region. This may make it possible to more precisely determine whether there is a bending failure and to improve product reliability.

The second resistor unit may have substantially the same shape as the first resistor unit DUx, and thus, an overlapping description of the second resistor unit will be omitted to avoid redundancy.

Figure 15:
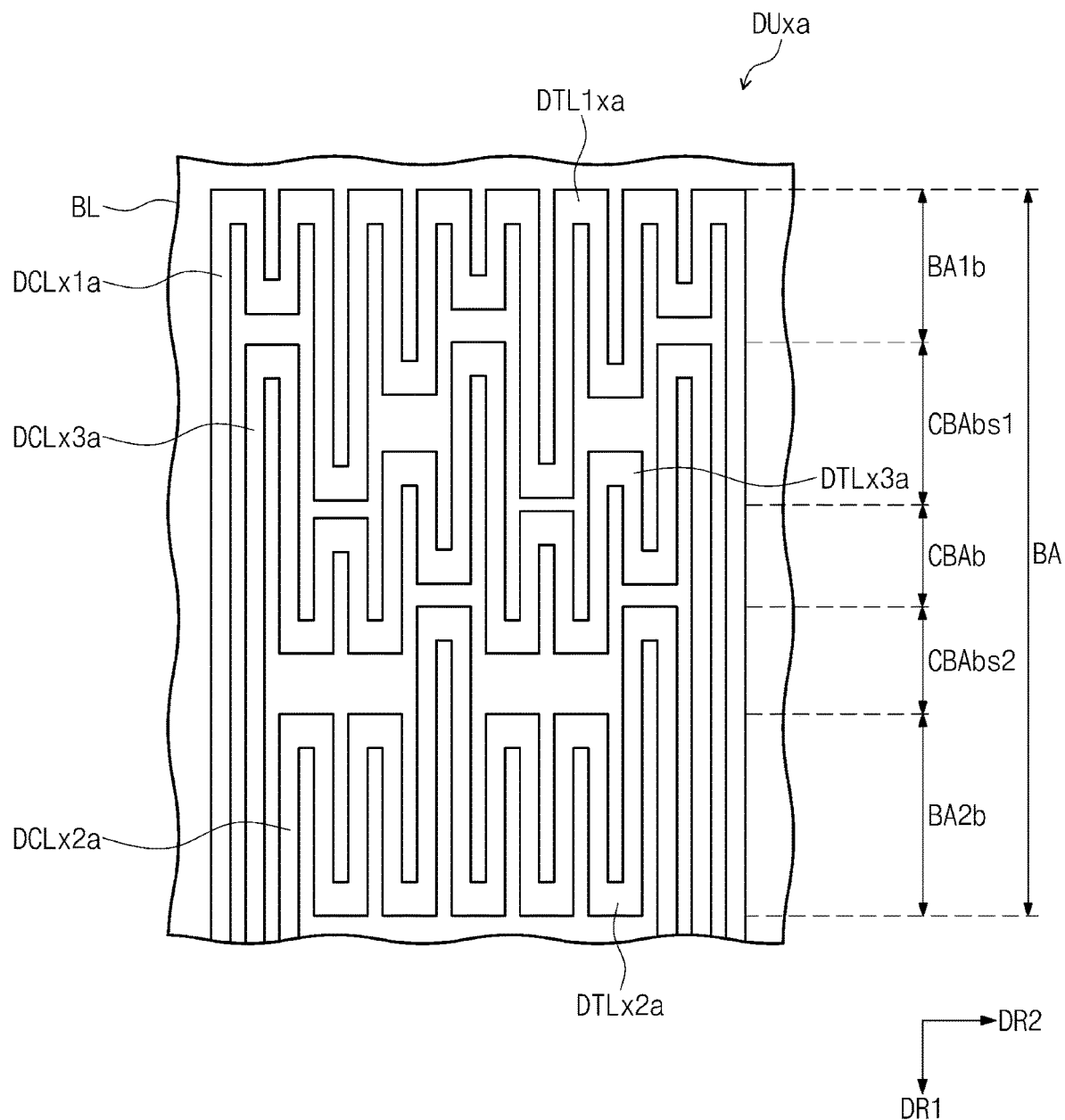
FIG. 15 is an enlarged plan view illustrating a portion of a display panel constructed according to an exemplary embodiment of the invention.

FIG. 15 is an enlarged plan view illustrating a portion of a display panel constructed according to an exemplary embodiment of the invention. FIG. 15 illustrates a region corresponding to the region "AA'" of FIG. 13.

The bending region BA of the base layer BL may include a first bending region BA1$b$, a second bending region BA2$b$, a central bending region CBA$b$, first sub-central bending region CBAbs1, and second sub-central bending region CBAbs2.

The first sub-central bending region CBAbs1 may be disposed between the first bending region BA1$b$ and the central bending region CBAb, and the second sub-central bending region CBAbs2 may be disposed between the second bending region BA2$b$ and the central bending region CBAb.

The first bending region BA1$b$, the first sub-central bending region CBAbs1, the central bending region CBAb, the second sub-central bending region CBAbs2, and the second bending region BA2$b$ may be sequentially arranged in the first direction DR1.

A first resistor unit DUxa may include a first resistor line DTLx1$a$, a second resistor line DTLx2$a$, a third resistor line DTLx3$a$, first resistor connection lines DCLx1$a$, second resistor connection lines DCLx2$a$, and third resistor connection lines DCLx3$a$.

A portion of the first resistor line DTLx1$a$ may be extended from the first bending region BA1$b$ toward the first sub-central bending region CBAbs1, a portion of the second resistor line DTLx2$a$ may be extended from the second bending region BA2$b$ toward the second sub-central bending region CBAbs2, a portion of the third resistor line DTLx3$a$ may be extended from the central bending region CBAb toward the first sub-central bending region CBAbs1, and another portion of the third resistor line DTLx3$a$ may be extended from the central bending region CBAb toward the second sub-central bending region CBAbs2. Thus, both of the first resistor line DTLx1$a$ and the third resistor line DTLx3$a$ may be disposed on the first sub-central bending region CBAbs1, and both of the second resistor line DTLx2$a$ and the third resistor line DTLx3$a$ may be disposed on the second sub-central bending region CBAbs2.

The second resistor unit may have substantially the same shape as the first resistor unit DUxa, and thus, an overlapping description of the second resistor unit will be omitted to avoid redundancy.

Figure 16:
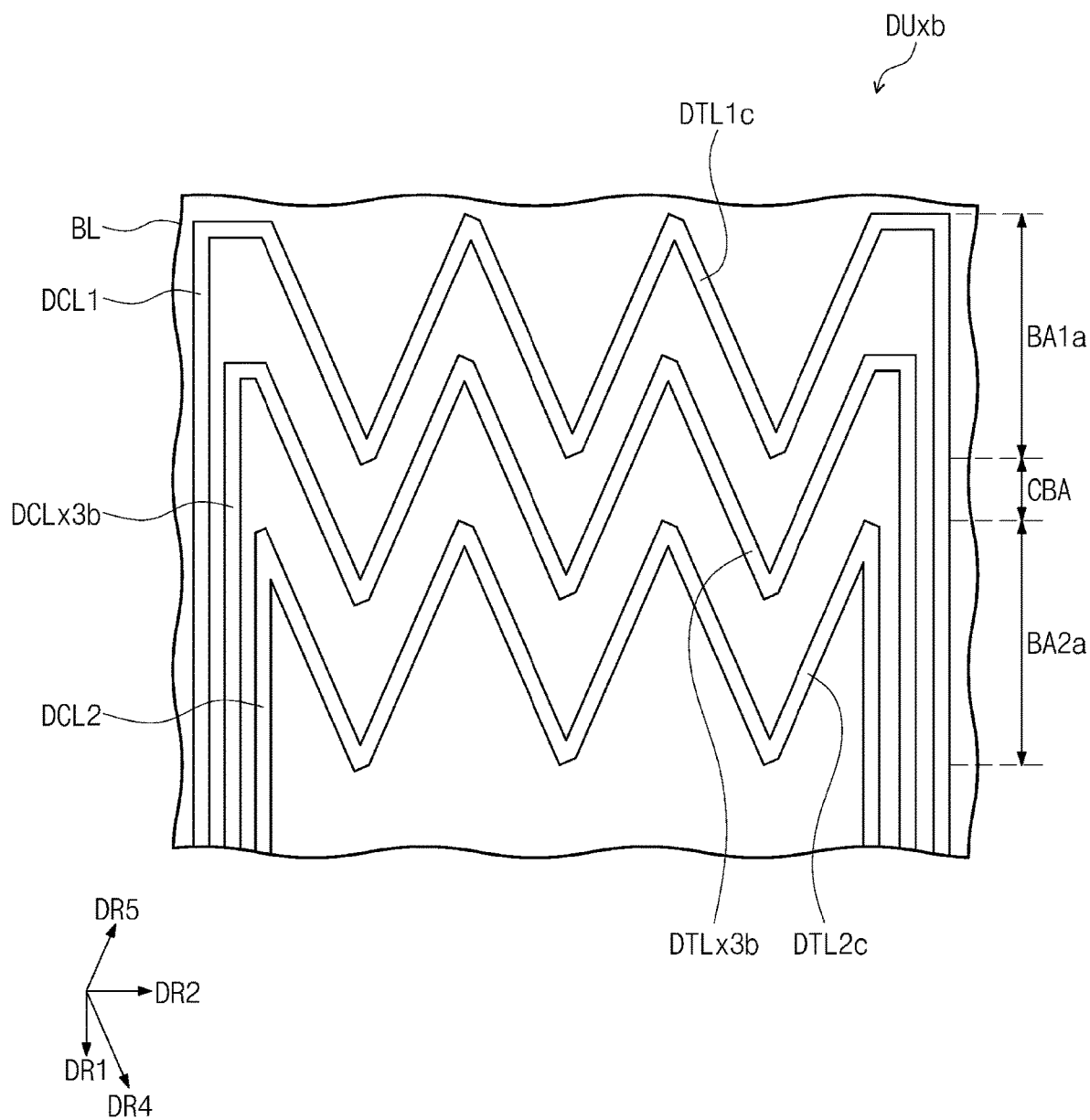
FIG. 16 is an enlarged plan view illustrating a portion of a display panel constructed according to an exemplary embodiment of the invention.

FIG. 16 is an enlarged plan view illustrating a portion of a display panel constructed according to an exemplary embodiment of the invention. FIG. 16 illustrates a region corresponding to the region "AA'" of FIG. 13.

When compared with the first resistor unit DU1$c$ of FIG. 11, the first resistor unit DUxb may further include a third resistor line DTLx3$b$ and third resistor connection lines DCLx3$b$.

The first resistor line DTL1$c$ may be disposed on the first bending region BA1$a$, and the second resistor line DTL2$c$ may be disposed on the second bending region BA2$a$. The third resistor line DTLx3$b$ may be disposed on the central bending region CBA, a portion of the third resistor line DTLx3$b$ may be extended toward the first bending region BA1$a$, and another portion of the third resistor line DTLx3$b$ may be extended toward the second bending region BA2$a$.

The third resistor line DTLx3$b$ may be disposed between the first resistor line DTL1$c$ and the second resistor line DTL2c, one of the third resistor connection lines DCLx3b may be connected to an end of the third resistor line DTLx3b, and another of the third resistor connection lines DCLx3b may be connected to an opposite end of the third resistor line DTLx3b.

In the second bending region BA2a, the third resistor connection lines DCLx3b may be disposed between the first resistor connection lines DCL1, and the second resistor connection lines DCL2 may be disposed between the third resistor connection lines DCLx3b.

The second resistor unit may have substantially the same shape as the first resistor unit DUxb, and thus, an overlapping description of the second resistor unit will be omitted to avoid redundancy.

Figure 17:
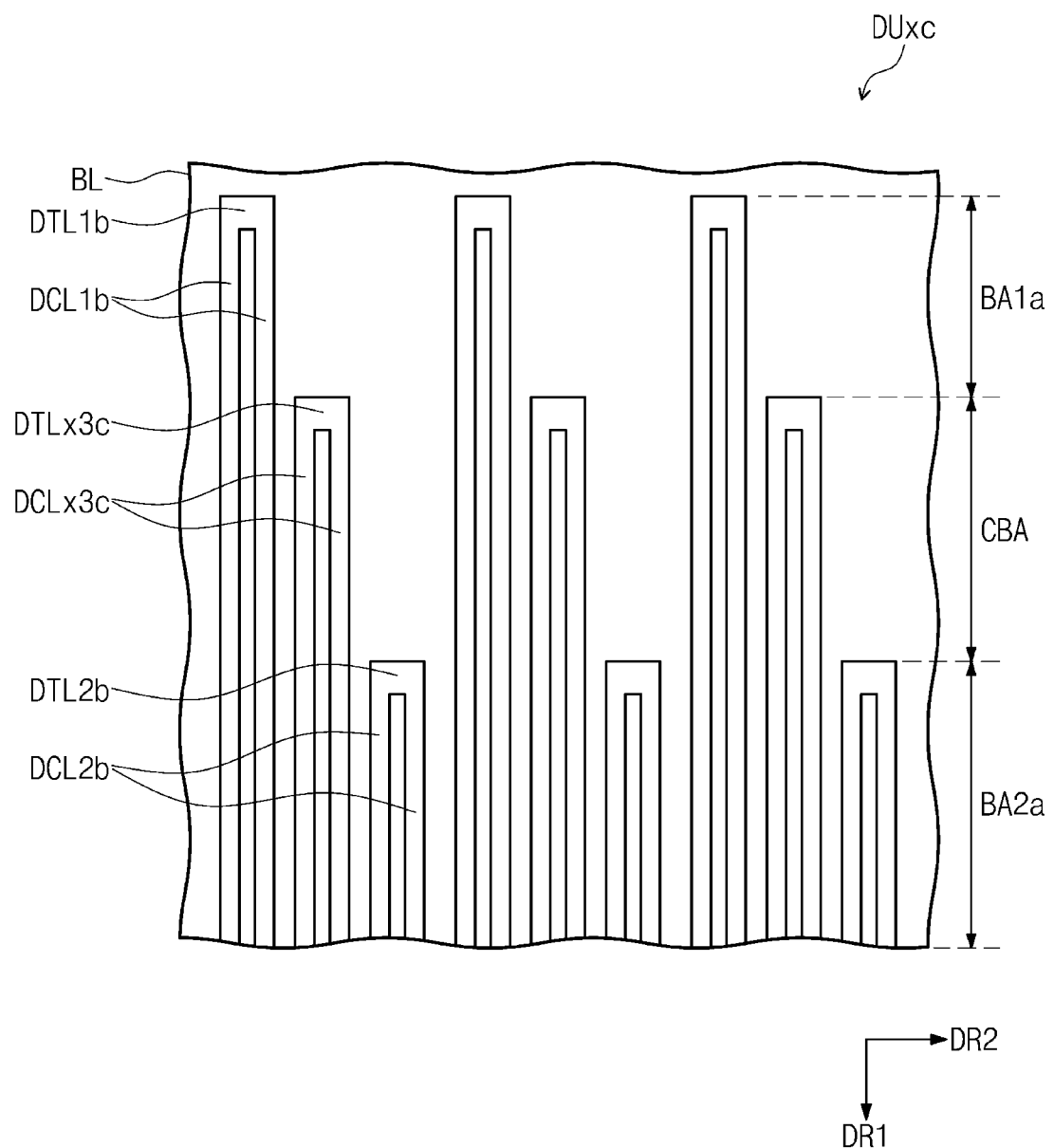
FIG. 17 is an enlarged plan view illustrating a portion of a display panel constructed according to an exemplary embodiment of the invention.

FIG. 17 is an enlarged plan view illustrating a portion of a display panel constructed according to an exemplary embodiment of the invention. FIG. 17 illustrates a region corresponding to the region "AA'" of FIG. 13.

When compared with the first resistor unit DU1b of FIG. 10, the first resistor unit DUxc may further include a third resistor line DTLx3c and third resistor connection lines DCLx3c.

The first resistor line DTL1b may be disposed on the first bending region BA1a, the second resistor line DTL2b may be disposed on the second bending region BA2a, and the third resistor line DTLx3c may be disposed on the central bending region CBA. The first resistor connection lines DCL1b may be extended from the first bending region BA1a to the second bending region BA2a through the central bending region CBA, and the third resistor connection lines DCLx3c may be extended from the central bending region CBA to the second bending region BA2a.

A resistance change caused by the bending of the central bending region CBA may be determined by subtracting a change in total resistance of the second resistor line DTL2b and the second resistor connection line DCL2b from a change in resistance of the third resistor line DTLx3c and the third resistor connection lines DCLx3c. In addition, a resistance change caused by the bending of the first bending region BA1a may be determined by subtracting a change in resistance of the third resistor line DTLx3c and the third resistor connection lines DCLx3c from a change in resistance of the first resistor line DTL1b and the first resistor connection line DCL1b.

The second resistor unit may have substantially the same shape as the first resistor unit DUxc, and thus, an overlapping description of the second resistor unit will be omitted to avoid redundancy.

Figure 18:
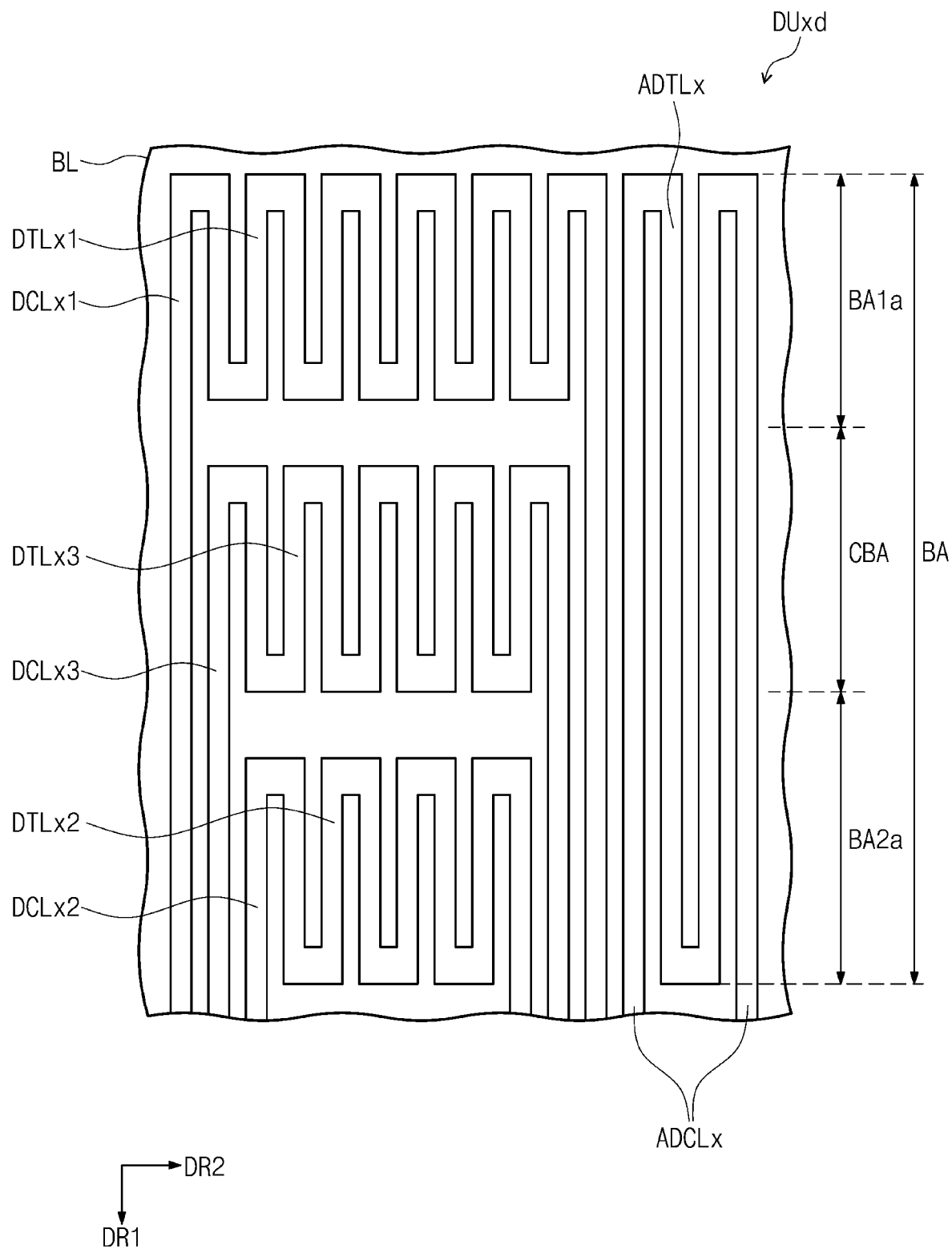
FIG. 18 is an enlarged plan view illustrating a portion of a display panel constructed according to an exemplary embodiment of the invention.

FIG. 18 is an enlarged plan view illustrating a portion of a display panel constructed according to an exemplary embodiment of the invention. FIG. 18 illustrates a region corresponding to the region "AA'" of FIG. 13.

When compared with the structure of FIG. 14, the first resistor unit DUxd may further include the average resistor line ADTLx and the average resistor connection lines ADCLx.

As a bending state of the entire bending region BA is changed, resistance values of the average resistor line ADTLx and the average resistor connection lines ADCLx may be changed. The second resistor unit may have substantially the same shape as the first resistor unit DUxd, and thus, an overlapping description of the second resistor unit will be omitted to avoid redundancy.

Figure 19:
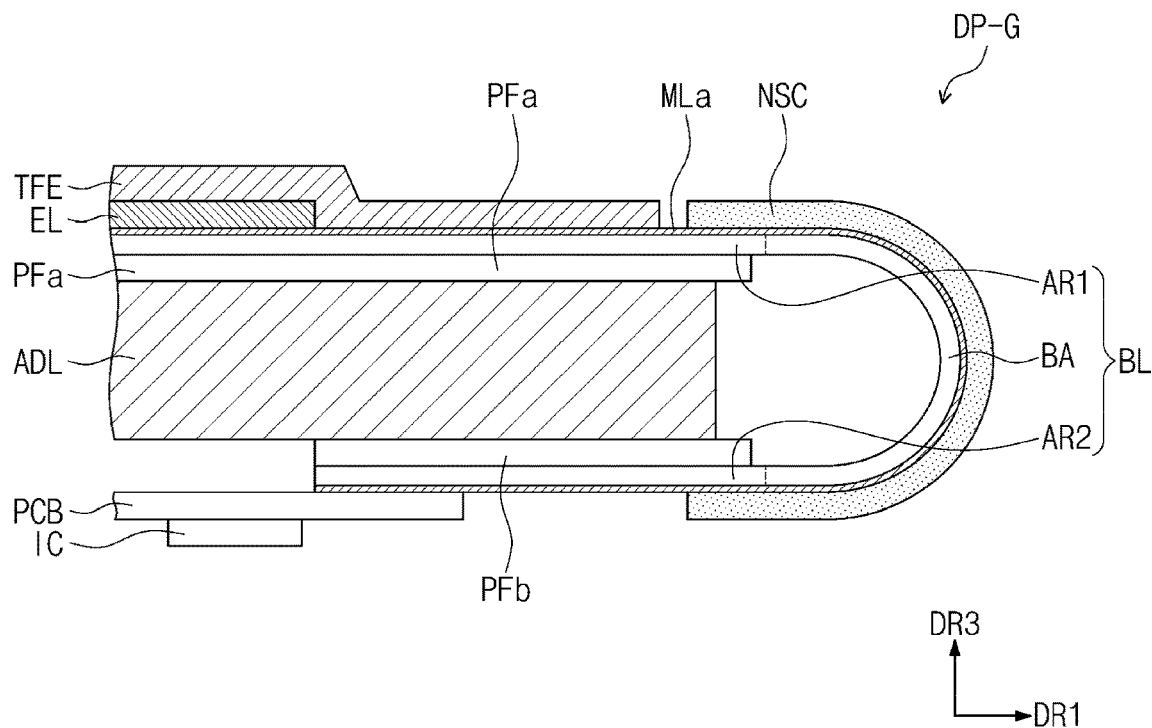
FIG. 19 is a sectional view illustrating a portion of a display panel in a first state, according to an exemplary embodiment of the invention.
Figure 20:
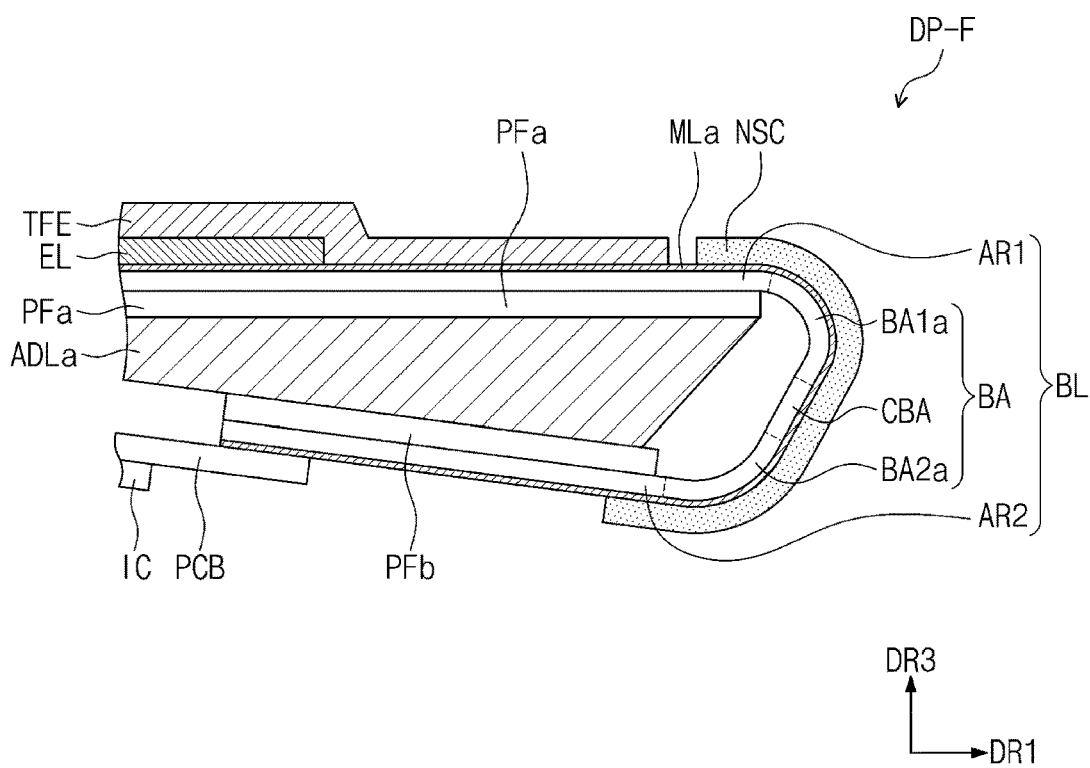
FIG. 20 is a sectional view illustrating a portion of a display panel in a second state, constructed according to an exemplary embodiment of the invention.

FIG. 19 is a sectional view illustrating a portion of a display panel in a first state, according to an exemplary embodiment of the invention, and FIG. 20 is a sectional view illustrating a portion of a display panel in a second state, according to an exemplary embodiment of the invention.

FIGS. 19 and 20 illustrate examples in which the bending region BA of the base layer BL is in a bent state. In the bent state, an adhesive layer ADL or ADLa may be disposed between the first and second regions AR1 and AR2 of the base layer BL. The first region AR1 and the second region AR2 may be coupled to each other by the adhesive layer ADL or ADLa.

In an exemplary embodiment, the adhesive layer ADL or ADLa may be disposed between the first and second protection films PFa and PFb and may be attached to each of the first and second protection films PFa and PFb. However, the invention is not limited to this example, and in the case where an additional enhancing member is disposed on a rear surface of the first protection film PFa, the adhesive layer ADL or ADLa may be attached to the enhancing member.

FIG. 19 illustrates the base layer BL, in which the first and second regions AR1 and AR2 are normally aligned to each other. That is, a display panel DP-G of FIG. 19 may be sorted as a good product.

FIG. 20 illustrate the base layer BL of a display panel DP-F, in which the first and second regions AR1 and AR2 are misaligned from each other. In FIG. 20, a shape of the adhesive layer ADLa disposed between the first and second regions AR1 and AR2 may be different from a shape of the adhesive layer ADL shown in FIG. 19.

In particular, in FIG. 20, a curvature radius of the first bending region BA1a may be smaller than a curvature radius of the second bending region BA2a. The smaller the curvature radius, the higher the probability that a crack occurs in signal lines. Thus, probability that crack occurs in signal lines disposed on the first bending region BA1a may be increased.

Resistance of the average resistor line ADTLx and the average resistor connection lines ADCLx of FIG. 18, which is measured when the base layer BL is not bent, may be referred with the unit of $\Omega_0$. When the base layer BL is bent as shown in FIG. 19, resistance of the average resistor line ADTLx and the average resistor connection lines ADCLx is 1.022 $\Omega_0$, and when the base layer BL is bent as shown in FIG. 20, resistance of the average resistor line ADTLx and the average resistor connection lines ADCLx is 1.020 $\Omega_0$.

In the case where only the resistance of the average resistor line ADTLx and the average resistor connection lines ADCLx is compared, both of the display panel DP-G of FIG. 19 and the display panel DP-F of FIG. 20 may be classified as good products. However, a crack may occur in signal lines disposed on the first bending region BA1a of the display panel DP-F of FIG. 20. The crack may not be detected by an inspection process. In other words, the crack, which is not detected by the inspection process, may gradually propagate, and a failure may occur while the display device DD (e.g., see FIG. 1) is used by a user.

In the display panel DP-F of FIG. 20, a first resistance change amount of the first resistor connection lines DCLx1, which are connected to the first resistor line DTLx1 and the first resistor line DTLx1 disposed on the first bending region BA1a, may be greater than a second resistance change amount of the second resistor connection lines DCLx2, which are connected to the second resistor line DTLx2 and the second resistor line DTLx2 disposed on the second bending region BA2a of the display panel DP-F. Furthermore, since the central bending region CBA has a relatively large curvature radius, a third resistance change amount of the third resistor line DTLx3 and the third resistor connection lines DCLx3 may be smaller than the first resistance change amount and the second resistance change amount.

According to an exemplary embodiment of the invention, a resistance measurement may be performed on each region of the bending region BA. This may make it possible to more precisely determine whether there is a bending failure and to improve product reliability. An example, in which the bending region BA is divided into two or three regions and a resistance measurement may be performed on each region, has been described in the specification. However, the invention is not limited to this example, and the resistance measurement may be performed on each of four or more regions.

According to an exemplary embodiment of the invention, a bending region of a base layer may be divided into a plurality of bending regions, and resistor lines may be respectively disposed on each of the divided bending regions in a one-to-one manner. Thus, it may be possible to detect a change in resistance for each bending region. This may make it possible to more precisely determine whether there is a bending failure and to improve product reliability.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a base layer including a display region, a pad region, and a bending region between the display region and the pad region, the bending region including a first bending region adjacent to the display region and a second bending region adjacent to the pad region;
pixels disposed on the display region;
pads disposed on the pad region;
a first resistor disposed on the first bending region;
a second resistor disposed on the second bending region; and
an average resistor line disposed on the first bending region and the second bending region, the average resistor line having a resistance which changes according to a change in a bending state of the entire bending region.

2. The display device of claim 1, further comprising signal lines electrically connected to the pixels and extending from the display region to the pad region through the bending region.

3. The display device of claim 2, wherein the display region, the bending region, and the pad region are sequentially defined along a first direction, and each of the first resistor and the second resistor is spaced apart from the signal lines in a second direction crossing the first direction.

4. The display device of claim 1, wherein the display region, the bending region, and the pad region are sequentially defined along a first direction, and
wherein a width of the display region in a second direction crossing the first direction is greater than a width of the bending region in the second direction.

5. The display device of claim 1, further comprising first connection lines connected to two opposite ends of the first resistor, and second connection lines connected to two opposite ends of the second resistor, wherein the second resistor is disposed between the first connection lines.

6. The display device of claim 5, wherein the first connection lines are disposed on the first bending region, the second bending region, and the pad region.

7. The display device of claim 5, wherein the second connection lines are disposed on the second bending region, and the pad region.

8. The display device of claim 1, wherein bending region is bent toward a rear surface of the display region, and the pad region is disposed under the display region.

9. The display device of claim 8, further comprising an adhesive layer disposed between the display region and the pad region.

10. The display device of claim 1, wherein each of the first resistor and the second resistor has a zig-zag type pattern.

11. The display device of claim 1, further comprising a printed circuit board attached to the pad region.

12. A display device, comprising:
a base layer including a first region and a second region adjacent to the first region in a first direction, the second region including a first bending region, a second bending region, and a central bending region between the first bending region and the second bending region;
a pixel disposed on the first region of the base layer;
a first resistor disposed on the second region of the base layer; and
a second resistor disposed on the second region of the base layer and spaced apart from the first resistor in the first direction,
wherein:
a portion of the first resistor is extended from the first bending region toward the central bending region, and a portion of the second resistor is extended from the second bending region toward the central bending region; and
both of the portion of the first resistor and the portion of the second resistor are disposed adjacent to each other in a second direction crossing the first direction on the central bending region.

13. The display device of claim 12, wherein each of the first resistor and the second resistor has a zig-zag type pattern.

14. The display device of claim 12, wherein a portion of the second region of the base layer is bent toward a rear surface of the first region of the base layer, and the first resistor and the second resistor are disposed in a bent portion of the base layer.

15. The display device of claim 14, further comprising an adhesive layer disposed between the first region and the second region to attach the second region to the rear surface of the first region.

16. The display device of claim 12, further comprising first connection lines connected to two opposite ends of the first resistor, and second connection lines connected to two opposite ends of the second resistor, wherein the second resistor is disposed between the first connection lines.

* * * * *